(12) United States Patent
Kitazawa et al.

(10) Patent No.: US 6,914,233 B2
(45) Date of Patent: Jul. 5, 2005

(54) WAFER MAPPING SYSTEM

(75) Inventors: Yasuyoshi Kitazawa, Toyohashi (JP);
Shigeto Suzuki, Tokyo (JP); Toshio Miki, Ise (JP); Susumu Nakagawa, Ise (JP); Katsumi Yasuda, Ise (JP); Kazunari Kitaji, Ise (JP)

(73) Assignee: Shinko Electric Co., Ltd., Tokyo (JP)

( * ) Notice: Subject to any disclaimer, the term of this patent is extended or adjusted under 35 U.S.C. 154(b) by 294 days.

(21) Appl. No.: 10/316,120

(22) Filed: Dec. 11, 2002

(65) Prior Publication Data

US 2003/0119214 A1 Jun. 26, 2003

(30) Foreign Application Priority Data

Dec. 12, 2001 (JP) ........................................ 2001-378835
Jun. 14, 2002 (JP) ........................................ 2002-174758

(51) Int. Cl.[7] .............................................. H01J 40/14
(52) U.S. Cl. ..................................... 250/221; 250/559.4
(58) Field of Search ............................. 250/221, 223 R, 250/559.3, 559.4; 414/936, 935

(56) References Cited

U.S. PATENT DOCUMENTS 5,225,691 A * 7/1993 Powers et al. ........... 250/559.4

* cited by examiner

Primary Examiner—Que T. Le
(74) Attorney, Agent, or Firm—Oblon, Spivak, McClelland, Maier & Neustadt, P.C.

(57) ABSTRACT

The wafer mapping system has an access port for transferring a wafer in and out and detects an accommodated wafer for a cassette in which slots for accommodating and holding inserted wafers are disposed in tiers. The wafer mapping system includes (1) a receiver that is fixed to a member facing the access port for receiving elements arranged serially along a height direction of the cassette, and (2) a transmitter that is disposed movable in an up and down direction of the cassette and transmits a signal toward a wafer accommodated in each of the slots of the cassette. The receiver receives a signal from the transmitter, and thereby the presence or absence of a wafer and a state of a wafer accommodated in each of the slots of the cassette are detected. Thereby, with a simple system configuration, an accommodation state of the wafer can be accurately detected.

19 Claims, 22 Drawing Sheets

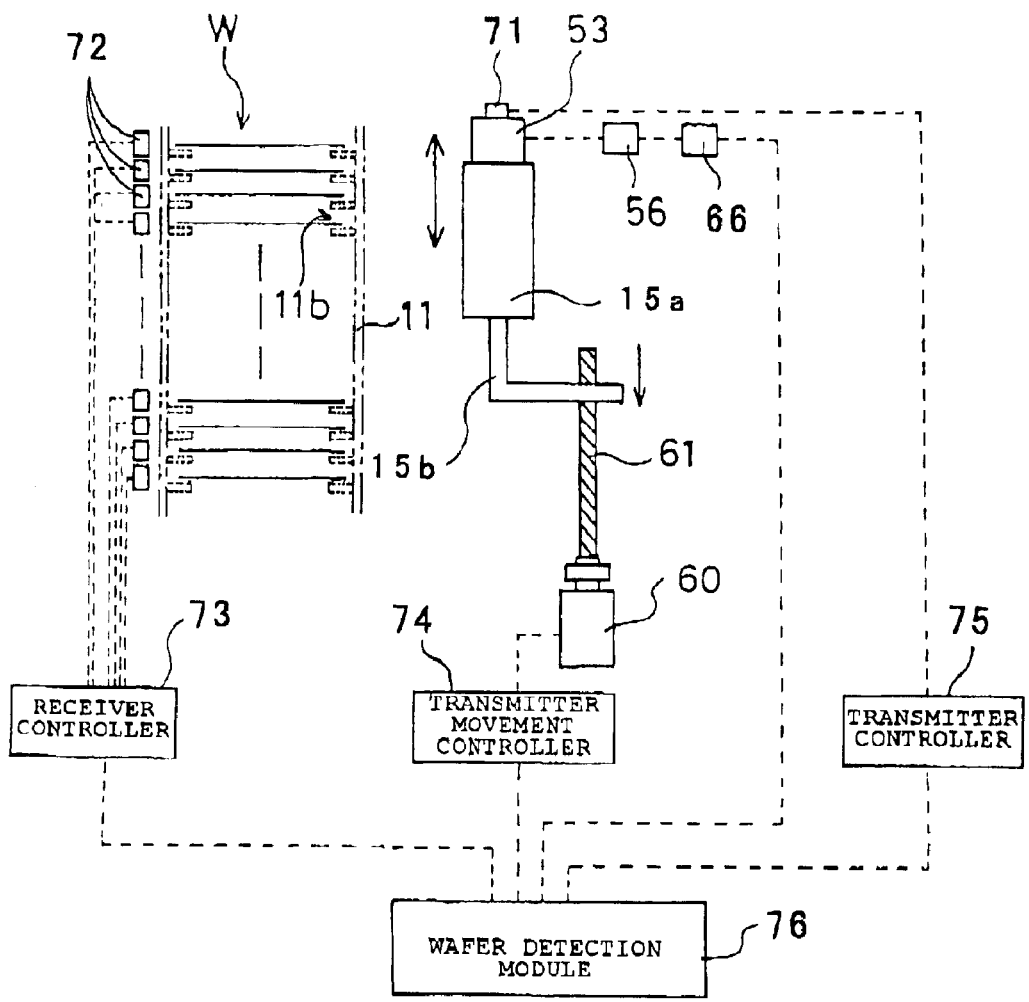

PSD OUTPUT WAVEFORM AT WAFER NORMAL POSITION

PSD OUTPUT WAVEFORM IN WAFER PROJETION STATE

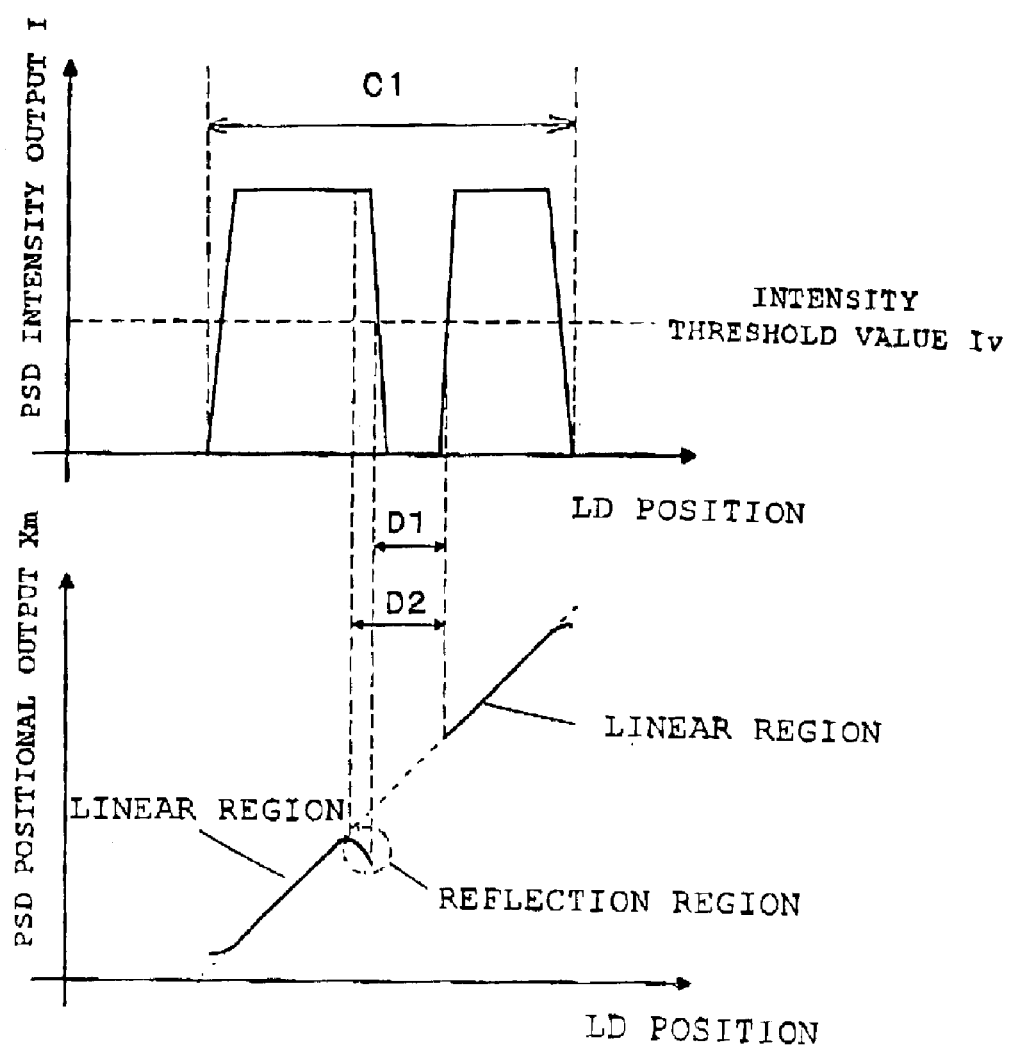

WAFER MAPPING SYSTEM

BACKGROUND OF THE INVENTION

1. Field of the Invention

The present invention relates to a wafer mapping system that detects the presence or absence of wafers accommodated in a wafer accommodation container (a cassette).

2. Description of the Related Art

When a wafer such as a semiconductor wafer is transferred in a fabricating process of a semiconductor product, usually a plurality of wafers is accommodated in a wafer accommodation container (hereinafter referred to as a cassette) and transferred between the respective steps. In a wafer processor, a necessary processing is applied to cassette by cassette. In this case, preceding the processing with the wafer processor, it is necessary to grasp an accommodation state of wafers for each cassette. Accordingly, in a wafer processor that processes wafers in a cassette, a wafer mapping system is disposed to detect the presence or absence of wafers. As the wafer mapping system, there is one that is disclosed in, for instance, JP-A-3-297156.

In the wafer mapping system disclosed in the publication, as a cassette for accommodating a plurality of wafers, a cassette called an open cassette is used. In the cassette, at a front side thereof an access port is opened to allow inserting and taking out a wafer, at a back side thereof an access port smaller than the access port is disposed. Furthermore, inside of the cassette, slots are formed in a plurality of tiers so as to hold the wafers substantially level. In a cassette susceptor where a cassette is placed prior to the processing of wafers, wafer detection means for identifying a wafer accommodation state in advance of the processing of the wafer is disposed. The wafer detection means is constituted of a transmission type sensor formed of a light-illuminating element and a light-receiving element that are disposed oppositely with a cassette disposed on a cassette susceptor sandwiched therebetween. When the transmission type sensor is moved in a up and down direction from a slot in the uppermost tier to one in the lowermost tier in the cassette, the presence or absence of a wafer accommodated in each of the slots in the cassette can be grasped.

However, in recent years, there is a tendency in a larger wafer size, accompanying this tendency, a new specification is stipulated of a cassette for accommodating wafers. A cassette in conformity to the specification is called a FOUP (Front Opening Unified Pod). In the FOUP, only one access port is disposed to insert and take out a wafer and to the access port a lid is detachably attached.

In the FOUP, since there is only one access port, different from the disclosure in JP-A-3-297156, the presence or absence of a wafer accommodated in each of slots of a cassette cannot be detected with the transmission type sensor that sandwiches the cassette fore and aft. Accordingly, in order to detect the presence of a wafer, a motion of once opening a lid attached to the access port becomes anyway inevitable. Because of the necessity of the motion, a motion for detecting the wafer becomes complicated, and a wafer mapping system tends to become complicated. In addition, there are various restrictions such as a wafer being accurately detected with difficulty and so on.

As a device that can alleviate these restrictions, a device that is disclosed in, for instance, U.S. Pat. No. 6,188,323 is known. In the device, after a lid of the FOUP is opened, with a mechanism that removes the lid lowering and retracting, a sensor formed of a pair of an illuminator and a photoreceiver that are attached to the mechanism detects the presence or absence of a wafer sequentially from top down in the cassette. The wafer can be detected by intercepting a light beam from a transmitter to a receiver.

However, even in the device disclosed in U.S. Pat. No. 6,188,323, to the mechanism that removes the lid, the respective sensors of a light emitting side and light receiving side have to be attached. Accordingly, it is inevitable that a structure of the wafer mapping system becomes complicated to a certain degree.

Furthermore, since in the wafer mapping system, both an illuminator and a light receiver, while moving, detect a wafer, a detection motion tends to be unstable. Accordingly, a high accuracy wafer mapping system that can accurately detect a wafer with more stability is demanded.

Furthermore, in such a case of a wafer being improperly accommodated, the wafer mapping system can properly detect the wafer with difficulty. FIG. 25 is a diagram showing a wafer accommodation state in a cassette 100 from an access port 101 side of the cassette 100, part of the cassette 100 being shown together with wafers 102 that are held and accommodated in the respective slots thereof. Of wafers 102a, 102d, and 102e and voids 103a through 103c shown in the drawing, with the wafer mapping system, the presence or absence of a wafer can be detected. However, in the wafer mapping system, with an illuminator and a light receiver simultaneously moving, the detection is performed depending on whether a light beam is intercepted by a wafer or not. Accordingly, of the wafer 102b in a multi-slotted state and the wafer 102c in a cross-slotted state, the wafer accommodation state cannot be properly detected.

SUMMARY OF THE INVENTION

A principal object of the present invention is to provide a high accuracy wafer mapping system that can, in a simple configuration, accurately detect a wafer accommodation state in a FOUP.

A wafer mapping system according to one aspect of the present invention is provided with an access port for inserting and taking out a wafer, and performs, to a wafer cassette in which slots for accommodating and holding level a plurality of inserted wafers are formed in a plurality of tiers, detection of the accommodated wafers, and the wafer mapping system comprises; a receiver that is fixed to a member opposite to the access port and made of receiving elements serially arranged along a height direction of the wafer cassette; and a transmitter that is disposed movable in a up and down direction of the wafer cassette and transmits a signal toward a wafer accommodated in each of the slots of the wafer cassette; wherein when the receiver receives a signal transmitted from the transmitter, the presence or absence of a wafer in each of the slots of the wafer cassette and a state thereof can be detected.

According to the configuration, while the receiver, constituted of receiving elements arranged serially, is fixed to the member opposite to the access port of the wafer cassette, only the transmitter moves up and down to detect the wafers. Accordingly, the signals transmitted from the transmitter can be stably detected. Furthermore, since only the transmitter moves up and down, a mechanism of the wafer mapping system can be simplified. By properly selecting a disposition density of the serially arranged receiving elements, even an improper wafer accommodation state such as a multi-slotted state or a cross slot state can be accurately detected. Accordingly, with a simple system configuration, a high precision detecting system capable of accurately detecting a wafer accommodation state in the FOUP can be obtained.

A wafer mapping system according to another aspect of the present invention is provided with an access port for inserting and taking out a wafer, and performs, to a wafer cassette in which slots for accommodating and holding level a plurality of inserted wafers are formed in a plurality of tiers, detection of the accommodated wafers, and the wafer mapping system comprises; a plurality of receivers that is attached to a member opposite to the access port and arranged serially along a height direction of the wafer cassette; and a transmitter that is disposed movable in a up and down direction of the wafer cassette and transmits a signal toward a wafer accommodated in each of the slots of the wafer cassette; wherein when the receiver receives a signal transmitted from the transmitter, the presence or absence of a wafer in each of slots in the wafer cassette and a state thereof can be detected.

According to the configuration, a plurality of receivers are serially attached to a member opposite to the access port of the wafer cassette and only the transmitter moves up and down to detect the wafers. Accordingly, the signals transmitted from the transmitter can be received with stability and a wafer accommodation state in the FOUP can be accurately detected. Furthermore, since only the transmitter moves up and down, the mechanism of the wafer mapping system can be simplified. In addition, by arranging a plurality of receivers in series, without needless trouble of fabricating a long integrated receiver, a wafer mapping system that can detect the wafers by moving up and down only the transmitter can be simply realized. Accordingly, with a simple configuration, a high accuracy wafer mapping system that can accurately detect a wafer accommodation state in the FOUP can be obtained.

The above and other objects, characteristics and advantages in the present invention will be clarified by reading the following explanations with reference to the attached drawings.

BRIEF DESCRIPTION OF THE DRAWINGS

FIG. 8 is a schematic diagram showing a control system of a wafer mapping system shown in FIG. 7;

FIG. 18 is a diagrams for explaining a modification embodiment of a wafer mapping system according to a second embodiment of the present invention, and shows distributions of an intensity output and a position output of a receiver detected when a wafer is accommodated at a tilt;

DESCRIPTION OF THE PREFERRED EMBODIMENTS

Embodiments of the present invention will be explained in the following. Although, for convenience sake, preferred embodiments of the present invention will be shown, the present invention is not restricted to the embodiments.

(First Embodiment)

First, a wafer mapping system 1 according to a first embodiment of the present invention will be explained.

Figure 1A:
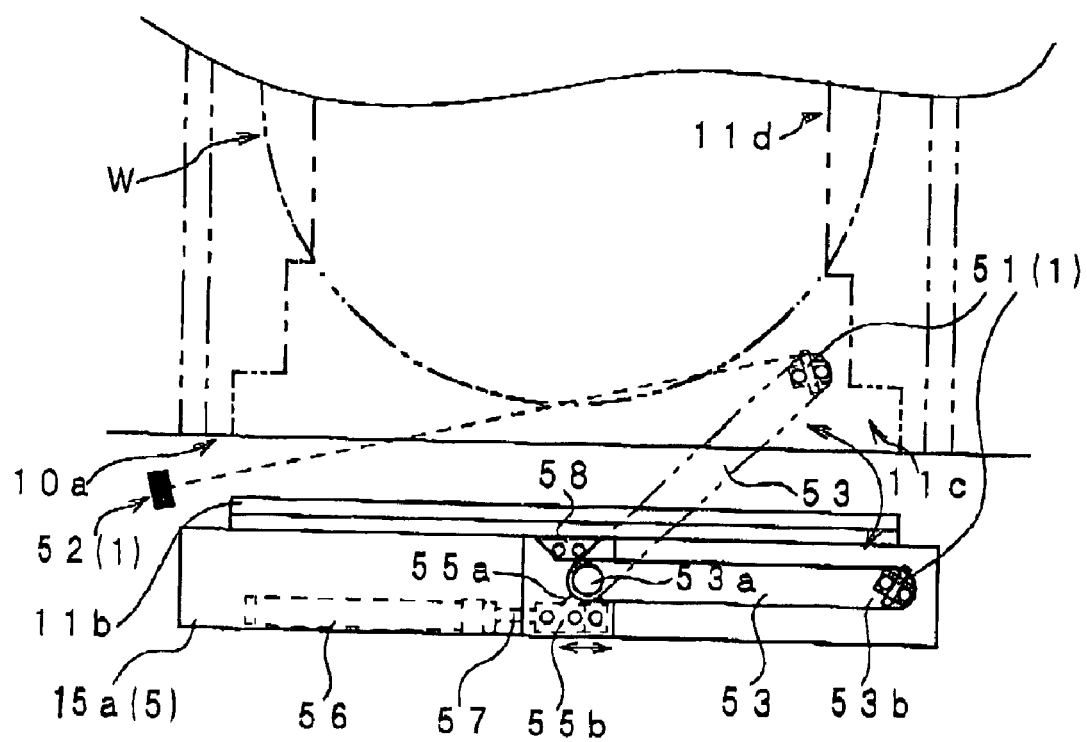
FIGS. 1A and 1B are drawings showing a state where a wafer mapping system according to a first embodiment of the present invention is attached to a wafer processor, FIG. 1A being a top view thereof, FIG. 1B being a view when seen from a wafer processor side.
Figure 1B:
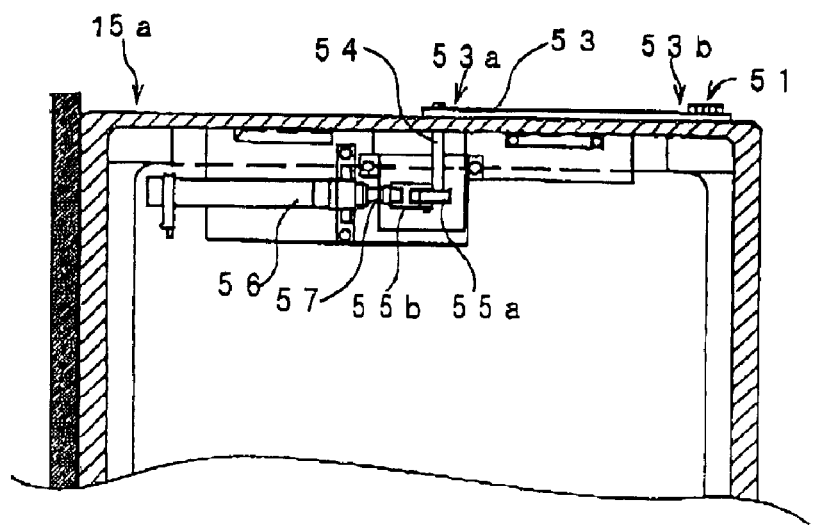
Figure 2:
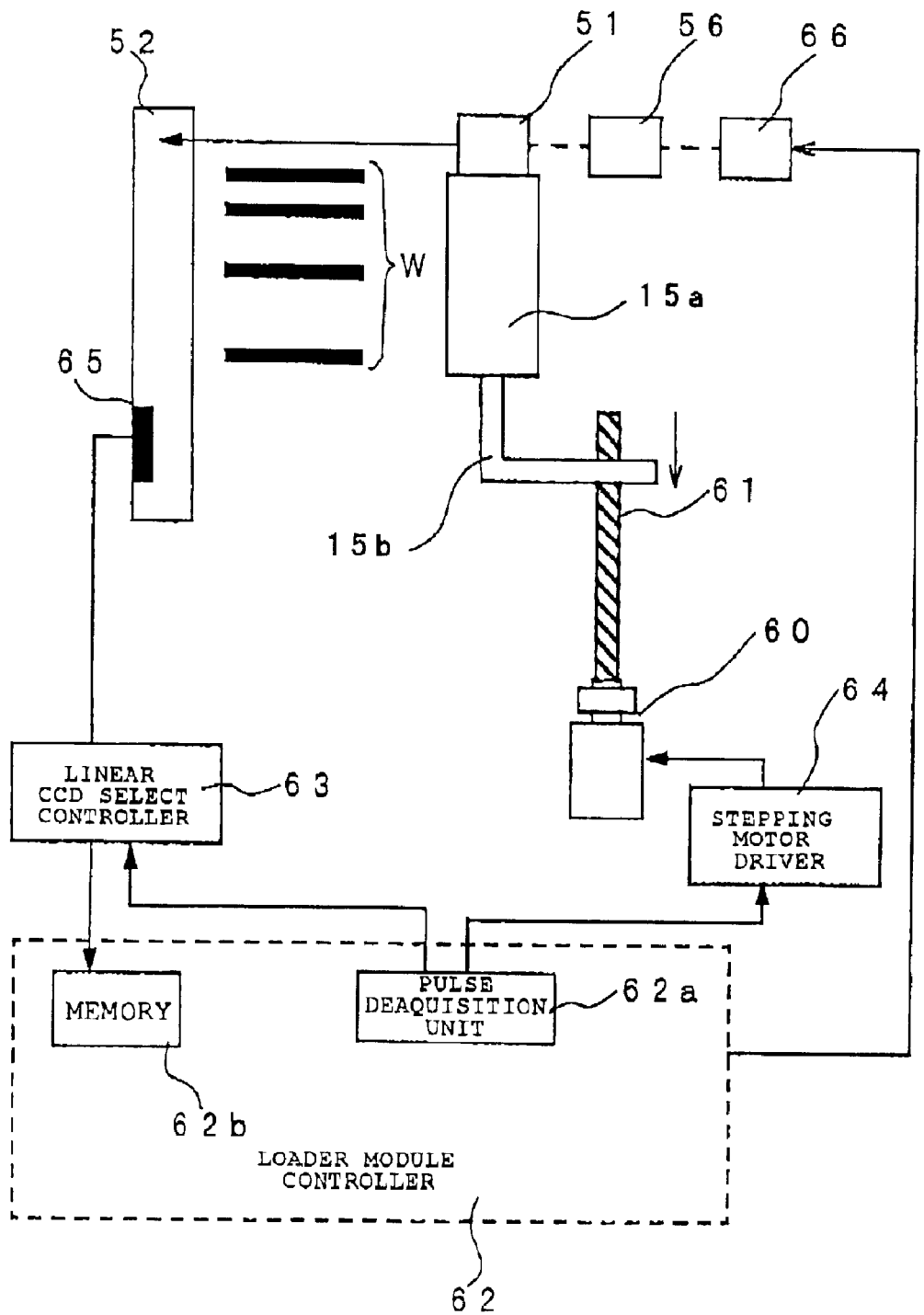
FIG. 2 is a schematic diagram showing a control system of the wafer mapping system shown in FIG. 1.

FIG. 1 shows a situation where a wafer mapping system 1 is attached to part of a wafer processor 50, FIG. 1A being a top view thereof and FIG. 1B being a side view seen from a wafer processor side. FIG. 2 is a schematic diagram showing a control system of the wafer mapping system 1. Furthermore, FIG. 3 is a diagram explaining a rough configuration of the wafer processor 50 therein the wafer mapping system 1 is used.

First, in FIG. 3, an outline of the wafer processor 50 therein the wafer mapping system 1 is used will be explained. In FIG. 3, the wafer processor 50 is illustrated as a side view partially including a section thereof. The wafer processor 50 is a wafer processor compatible with a cassette called a FOUP (Front Open Unified Pod) in which a lid is attached to an access port through which a wafer is inserted and taken out.

Figure 3:
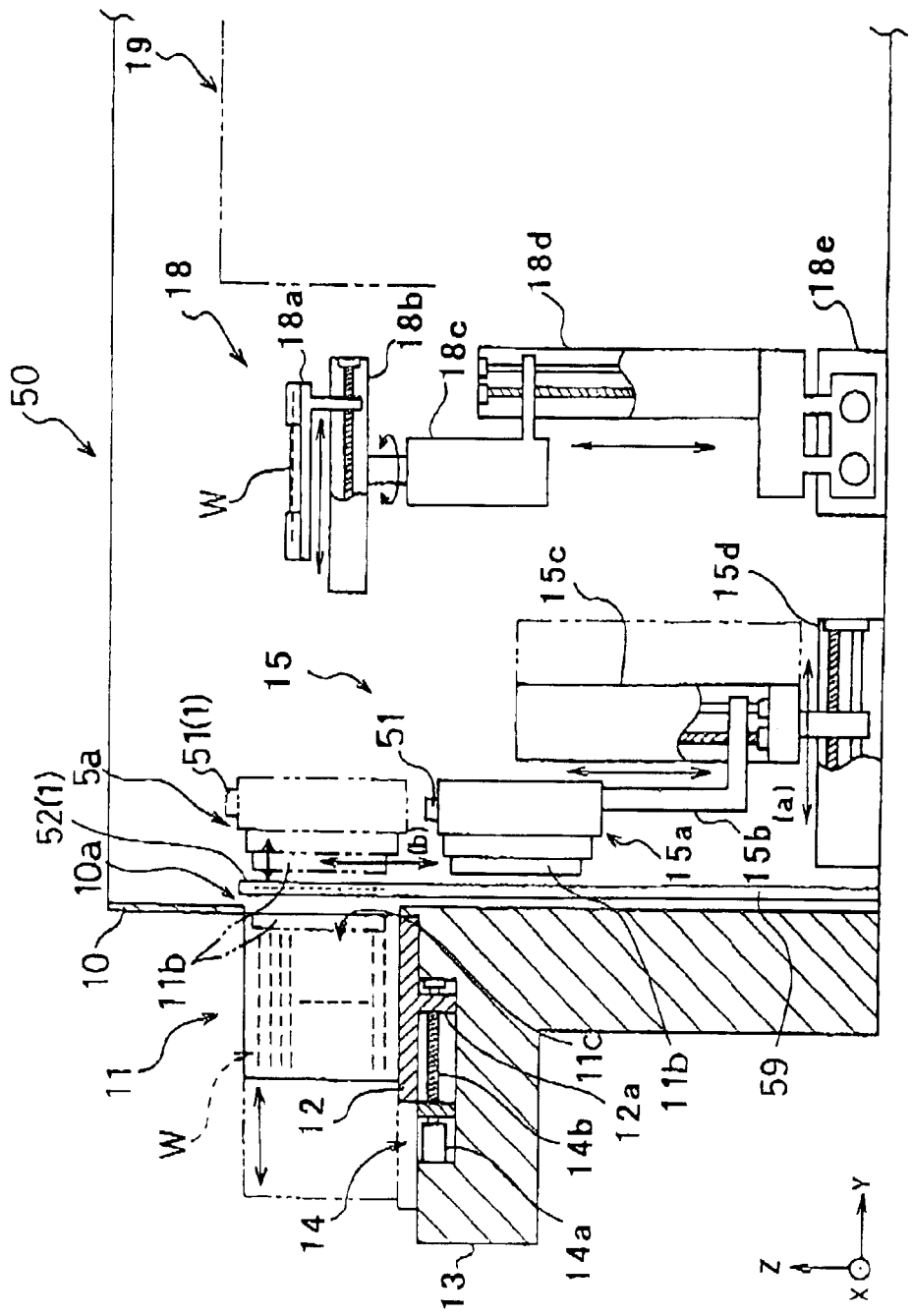
FIG. 3 is a diagrammatic representation of a wafer processor thereto the wafer mapping system shown in FIG. 1 is attached.

In the wafer processor 50, a susceptor portion 13 (only one is shown in FIG. 3) on which a plurality of cassette stages 12 is disposed to place cassettes 11, and a process portion 19 (details are not shown in the drawing) that takes out a wafer W from a FOUP 1 (hereinafter referred to as "cassette 11") and applies a preset processing to the wafer W are disposed separated with a separation wall 10. In the separation wall 10, a passage 10a is disposed at a position corresponding to each of the cassette stages 12. A shield plate driver 15 (hereinafter referred to as "shutter driver 15") having a shield plate 15a (hereinafter referred to as "shutter 15a") that opens and closes the passage 10a and a wafer transfer device 18 are further disposed between the separation wall 10 and the process portion 19.

Figure 24:
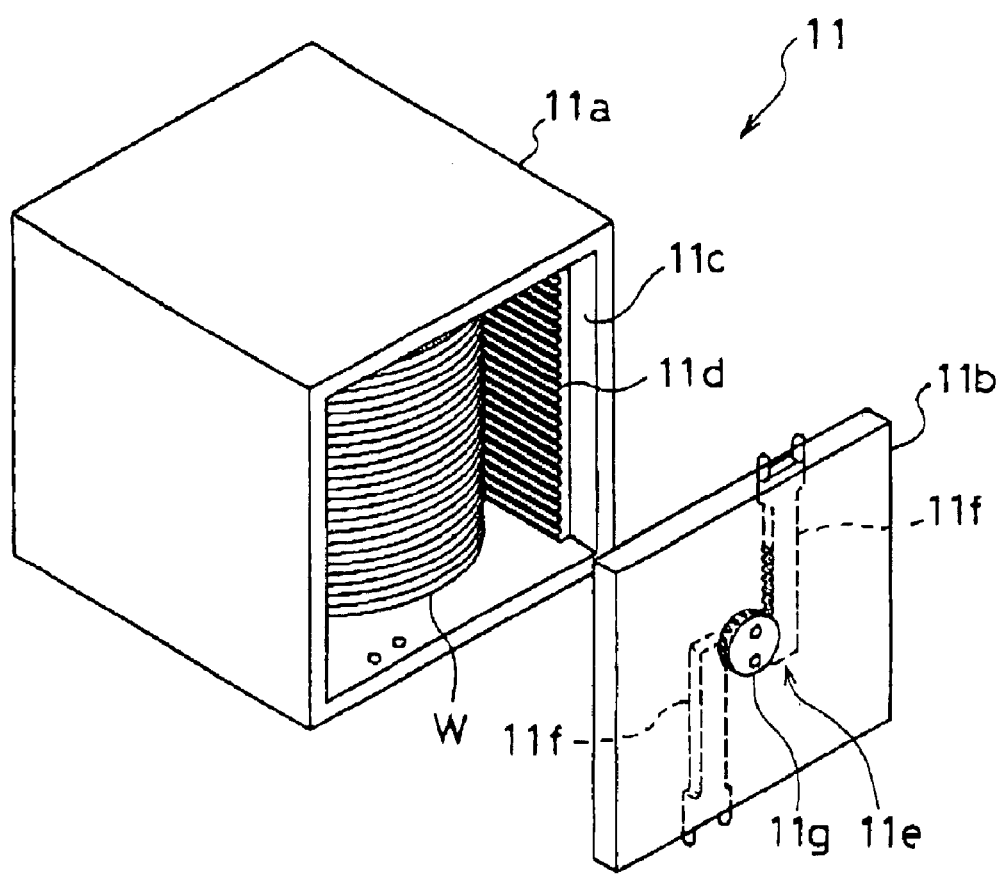
FIG. 24 is a perspective view showing a state where wafers are accommodated in a FOUP.
Figure 25:
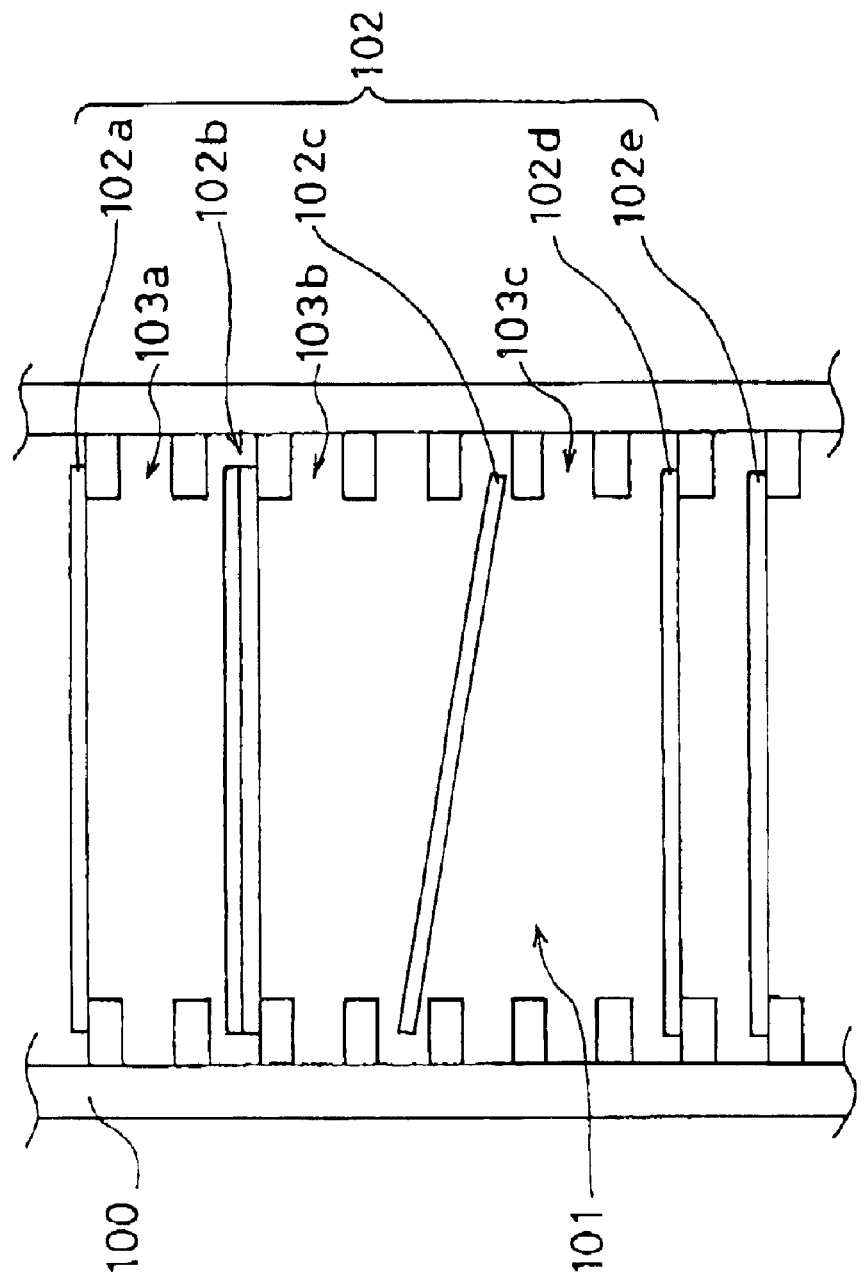
FIG. 25 is a diagram for explaining an accommodation state of wafers in the FOUP.

The cassette 11 is illustrated in FIG. 24. The cassette 11 is constituted of a housing 11a that accommodates wafers W and a lid 11b that can be detachably engaged with an access port 11c that is provided to the housing 11a. On an inner wall of the housing 11a, multi-tiered slots 11d are disposed opposite to each other. In each of the slots 11d, a wafer W is accommodated held substantially level. In the lid 11b, a fixing mechanism 11e that fixes the lid 11b to the housing 11a is buried. The fixing mechanism 11e is constituted of two rack threaded lock members 11f and a freely rotatable pinion 11g that can engage with the rack. When the pinion 11g rotates, the lock member 11f projects from the lid 11b, and thereby the housing 11a and the lid 11b are fixed.

Once more, in FIG. 3, the cassette stage 12, by use of a cassette drive mechanism 14 disposed there under, is configured so as to be able to freely proceed and retreat in a separation wall 10 direction (Y axis direction). The cassette drive mechanism 14 is configured so that an electric motor 14a may drive a screw shaft 14b that engages with a convexity 12a disposed on a bottom surface of the cassette stage 12. When the cassette 11 is placed on the cassette stage 12, the electric motor 14a positively rotates the screw shaft 14b and makes the cassette stage 12 proceed toward the separation wall 10. When all wafers W in the cassette 11 have been processed, the electric motor 14a reversely rotates the screw shaft 14b and thereby allows the cassette stage 12 to retreat.

In the separation wall 10, the passage 10a is formed at a position facing the cassette 11 so as to be a substantially the same dimension as the cassette 11. The passage 10a is used to take out a wafer W from the cassette 11 and accommodate it therein, and when the cassette 11 is not placed on the cassette stage 12, in order to isolate an atmosphere of the process portion 19 from that of the susceptor 13, the passage 10a is closed with the shutter 5a.

To the shutter 15a of the shutter driver 15, a transmitter 51 of a wafer mapping system 1 described later is attached. The shutter 15a is attached through a support member 15b to an elevator 15c.

The support member 15b is formed into a downwardly extended L-shaped arm shape. A base end portion of the support member 15b is attached to the elevator 15c, and the support member 15b is elevated and lowered in a Z-axis direction by use of the elevator 15c. Furthermore, by means of a forward and backward movement mechanism 15d that further supports the elevator 15c, the support member 15b can be driven so as to proceed and retreat even in a Y-axis direction.

The elevator 15c is constituted of a screwdriver mechanism that drives, with a not shown electric motor, a screw shaft that engages with the base portion of the support member 15b. The forward and backward movement mechanism 15d is also constituted of a screwdriver mechanism that drives the elevator 15c to proceed and retreat in a Y-axis direction. By use of the forward and backward movement mechanism 15d and the elevator 15c, the shutter 15a can be moved forward and backward and elevated. That is, an arrow mark (a) in FIG. 3 shows a forward and backward movement direction, and an arrow mark (b) shows an ascending and descending direction. In FIG. 3, states of the shutter 15a before and after the elevation after the lid 11b of the cassette 11 is removed are illustrated.

Between the shutter driver 15 and the process portion 19, the wafer transfer device 18 is disposed. In the wafer transfer device 18, after an accommodation state of the wafers W in the cassette 11 is detected with a wafer mapping system 1 described later, a wafer W is taken out of the cassette 11 and delivered to the process portion 19. After the processing of the wafer W at the process portion 19 is completed, the wafer transfer device 18 receives the wafer W and accommodates it again in the cassette 11. The wafer transfer device 18 has an arm 18a that holds a wafer W, and the arm 18a is configured so that it can be moved forward and backward in a level plane by means of a screwdriver mechanism provided to an arm support table 18b. The arm support table 18b is connected to and supported by an output shaft of an electric motor built in an arm rotation table 18c. Owing to the rotation of the electric motor, the arm 18a can rotate in a level plane. Furthermore, the arm rotation table 18c, by means of the elevator 18d constituted of a screwdriver, can be elevated. Still furthermore, the elevator 18d is mounted on a slider 18e capable of sliding in an X-axis direction in the drawing.

In the above, the wafer processor 50 in which a wafer mapping system 1 according to the present embodiment is used is explained. In the wafer processor 50, an accommodation state of the wafers W in the cassette 11 is detected with a wafer mapping system 1 described later, and based on the detected information, the wafers W are processed cassette by cassette 11.

In the following, a wafer mapping system 1 will be explained. As shown in FIGS. 1 through 3, the wafer mapping system 1 includes a transmitter 51 that transmits a beam (beam of light) that is a signal, and a receiver 52 that receives the signal transmitted from the transmitter 51. The transmitter 51 is attached through an arm 53 to a shutter driver 15 that moves forward and backward and elevates a shutter 15a that removes a lid 11b of the cassette 11 and opens and closes an access port 11c. The arm 53 is attached in a wobbling state at one end 53a to an upper portion of the shutter 15a, and to the other end 53b thereof the transmitter 51 is attached.

The transmitter 51 is connected to a not shown light source with, for instance, optical fibers. When the arm 53 wobbles and gyrates and proceeds toward the inside of the access port 11c of the cassette 11 as described later, a signal is transmitted to a wafer W accommodated in each of slots 11d of the cassette 11. The presence or absence of the wafer W and the state thereof can be detected when the wafer W intercepts a signal passage from the transmitter 51 to the receiver 52.

A mechanism that allows gyrating and wobbling the arm 53 thereto the transmitter 51 is attached is shown in FIG. 1. One end 53a that becomes a wobble center of the arm 53 is attached to a wobble shaft 54 that is supported freely rotatable through a bearing (FIG. 1B). To an end on a side opposite to that thereto the arm 53 is attached in the wobble shaft 54, a link member 55a is attached. The link member 55a is attached wobbling free to a link member 55b on an opposite side thereof. Furthermore, the link member 55b, on an opposite side thereof, is attached wobbling free to a rod 57 disposed to an air cylinder 56. With the configuration, by switching a compressed air supplied to the air cylinder 56 to move fore and aft the rod 57, the wobble shaft 54 is allowed gyrating through the link members 55a and 55b by a preset angle of rotation. Accompanying the gyration, the arm 53 wobbles, and thereby the transmitter 51 proceeds toward into the cassette 11. That is, when the rod 57 is projected from the air cylinder 56, the transmitter 51 proceeds from the access port 11c into the cassette 11.

Thus, when the transmitter 51 proceeds into the cassette 11, by use of a signal passage formed between the transmitter 51 and the receiver 52, a state of a wafer W can be detected. Furthermore, since the transmitter 51 is attached to an upper portion of the shutter 15a, as the shutter 15a moves up and down, the transmitter 51 moves up and down accordingly. With the configuration, the wafer W accommodated in each of the slots 11d of the cassette 11 can be sequentially detected as the shutter 15a descends. Thus, since simultaneously with the up and down movement of the shutter driver 15, the detection of the wafer W is performed, the wafer W can be speedily detected, and since there is no need of providing an elevation mechanism for use in the transmitter 51, a mechanism of a wafer mapping system can be simplified.

At an upper portion of the shutter 15a, in the neighborhood of one end 53a of the arm 53, a stopper 58 is disposed (FIG. 1A). The stopper 58, when the transmitter 51 proceeds into the cassette 11, comes into contact with a side surface of the arm 53 and thereby restricts a gyration range of the arm 53, and thereby performing positioning of the transmitter 51. Thereby, minute dispersion in positioning when the rod 57 is driven with the air cylinder 56 can be suppressed, resulting in an accurate positioning of the transmitter 51.

In the next place, the receiver 52, will be explained. As shown in FIGS. 1 and 3, the receiver 52 is disposed fixed to a member 59. The member 59 is located so as to face the access port 11c when the cassette 11 is placed on a cassette stage 2 and an access port 11c of the cassette 11 is faced to a passage 10a of a separation wall 10, and the receiver 52 is fixed to the member 59. The receiver 52 is constituted of receiving elements serially arranged along a height direction of the cassette 11. In the present embodiment, as the receiver 52, a linear CCD camera constituted of CCD elements is used. By use of the CCD camera, received signals can be electronically processed, resulting in a high precision detection.

As mentioned above, the wafer mapping system 1 includes the transmitter 51 that is attached to an upper portion of the shutter 15a and becomes a line light source attached freely movable toward inside of the cassette 11, and the receiver 52 constituted of a linear CCD camera fixed to a member 59 positioned so as to face an access port 11c of the cassette 11. While the transmitter 51 descends together with the shutter 15a, on the side of the receiver 52, a signal transmitted from the transmitter 51 is received, and at a position where a wafer W is present, a signal passage is intercepted, resulting in detecting the wafer W. Accordingly, the wafer detection can be carried out assuredly and accurately.

Furthermore, in the wafer mapping system 1, since the receiver 52 is fixed and only the transmitter 51 moves up and down to detect the wafer W, the signal can be stably received. In the wafer mapping system 1, since only the transmitter 51 moves up and down, the mechanism of the wafer mapping system can be simplified.

Subsequently, a control system for detecting the wafer W will be explained with reference to FIG. 2. FIG. 2 schematically shows relationship among the transmitter 51, the receiver 52, the wafers W, and a stepping motor 60 and a screw shaft 61 provided in the driver 15 to elevate the shutter 15a. The transmitter 51 can be moved up and down through the shutter 15a and the support member 15b by use of the stepping motor 60 and the screw shaft 61.

In FIG. 2, the wafer mapping system 1 includes a linear CCD select controller 63 (hereinafter referred to as "select controller 63") that processes the signals received at the receiver 52, and a loader module controller 62 (hereinafter referred to as "loader module 62") that performs communication between a stepping motor driver 64 that controls the stepping motor 60 and the select controller 63. Furthermore, the receiver 52 is provided with a linear CCD controller 65 (hereinafter referred to as "CCD controller 65") that opens and closes, based on an instruction from the select controller 63, a gate at a position where a receiving element corresponding to a movement position of the transmitter 51 is positioned.

The loader module 62 includes a pulse deaquisition unit 62a that gives a pulse instruction to the stepping motor driver 64 and the select controller 63, and a memory portion 62b that stores information received from the select controller 63.

First, in the loader module 62, a forward and backward movement mechanism 15d of the shutter driver 15, at a timing when the shutter 15a is retracted and the lid 11b of the cassette 11 has been removed (FIG. 3), transmits a switching instruction to an electromagnetic valve 66 that switches supply of a compressed air to the air cylinder 56. Thereby, the rod 57 proceeds relative to the air cylinder 56, and thereby the transmitter 51 is allowed proceeding into the cassette 11 (FIG. 1).

In this state, from the pulse deaquisition unit 62a of the loader module 62 to the stepping motor driver 64 and the select controller 63, pulse instructions are transmitted. The stepping motor driver 64, according to the pulse signal transmitted from the pulse deaquisition unit 62a, rotates the stepping motor 60. Accompanying the rotation of the stepping motor 60, the screw shaft 61 rotates, and thereby together with the not shown shutter 15a, the transmitter 51 starts descending. At this time, an optical signal is guided from a not shown light-emitting source through an optical fibers to the transmitter 51, and from the transmitter 51, a light beam that is a signal is transmitted to the receiver 52.

Furthermore, the pulse instruction is simultaneously transmitted from the pulse deaquisition unit 62a also to the select controller 63. Thereby, in the select controller 63, a position in an up and down direction of the transmitter 51 in motion (position in a height direction of the cassette 11) can be identified.

The select controller 63, upon receiving the pulse instruction from the pulse deaquisition unit 62a, counts the number of the pulses and thereby identifies a movement zone of the transmitter 51, and selects a zone (not shown) where a receiving element on the side of the receiver 52 that corresponds to a position of the transmitter 51 is located. Then, selected zone information is transmitted from the select controller 63 to the CCD controller 63, and the CCD controller 65 opens a gate (not shown) corresponding to the receiving element zone. Thereby, the signal transmitted from the transmitter 51 is received.

Subsequently, according to the movement of the transmitter 51, that is, according to the counting of the pulse signals transmitted from the pulse deaquisition unit 62a, the select controller 63 sequentially selects a zone of a corresponding receiving element, and the CCD controller 65 sequentially opens only the gate corresponding to the zone. This process is continued until the transmitter 51 completes a movement in a height direction of the cassette 11, and the result received at each of zones is transmitted one at a time to the select controller 63 and stored in a not shown memory of the select controller 63. At this time, while the signal transmitted from the transmitter 51 is intercepted at a position where the wafer W is present and is not received by the receiver 52, at a position where a wafer W is not present the signal reaches the receiver 52 as it is and is received there.

When the movement in a cassette height direction of the transmitter 51 has come to completion, in the select controller 63, statistical processing is applied to the reception results stored in the memory, and thereby the presence of a wafer and the state thereof in each of slots 11d in the cassette 11 are detected. Then, the detected results are transmitted to the loader module 62 and stored in the memory 62b of the loader module 62. Wafer detection information of the cassette 11 stored in the memory 62b (detection result of the accommodation state of the wafers W in the cassette 11) is transmitted to the process portion 19 and is used later when the wafers W in the cassette 11 are processed.

In the next place, a configuration for selecting a zone where a receiving element corresponding to a position of the transmitter 51 in motion is located, and the statistical processing at the select controller 63 will be detailed.

Figure 4A:
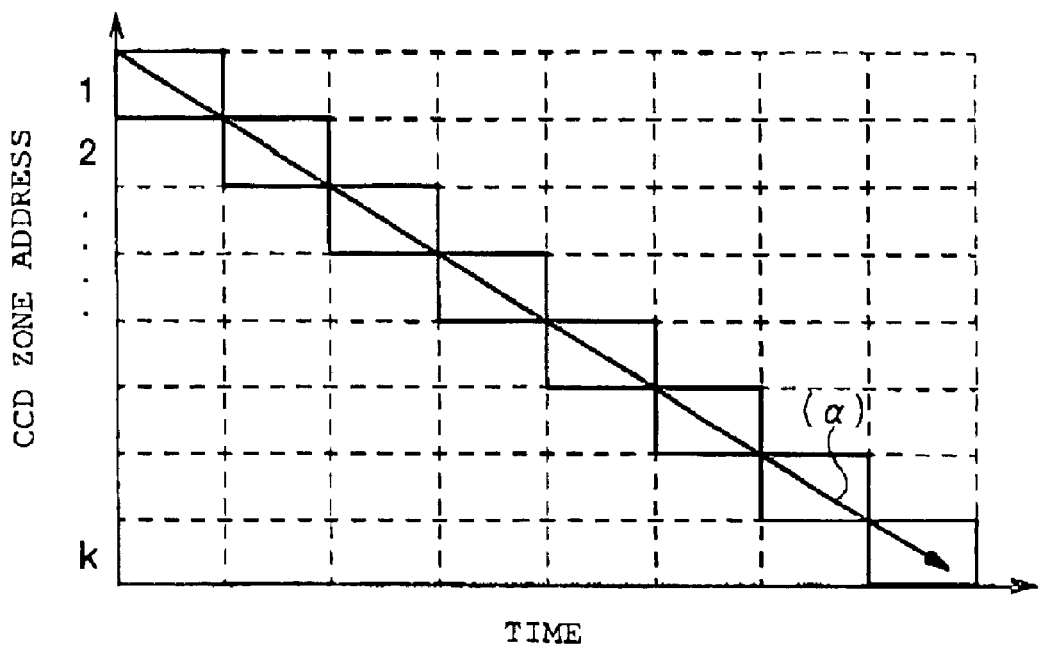
FIG. 4A is a diagram explaining relationship between a position of a transmitter in motion and a zone of a receiving element selected corresponding to the transmitter in motion, FIG. 4B being a schematic diagram showing correspondence of the respective slots of a cassette and the corresponding zones.
Figure 4B:
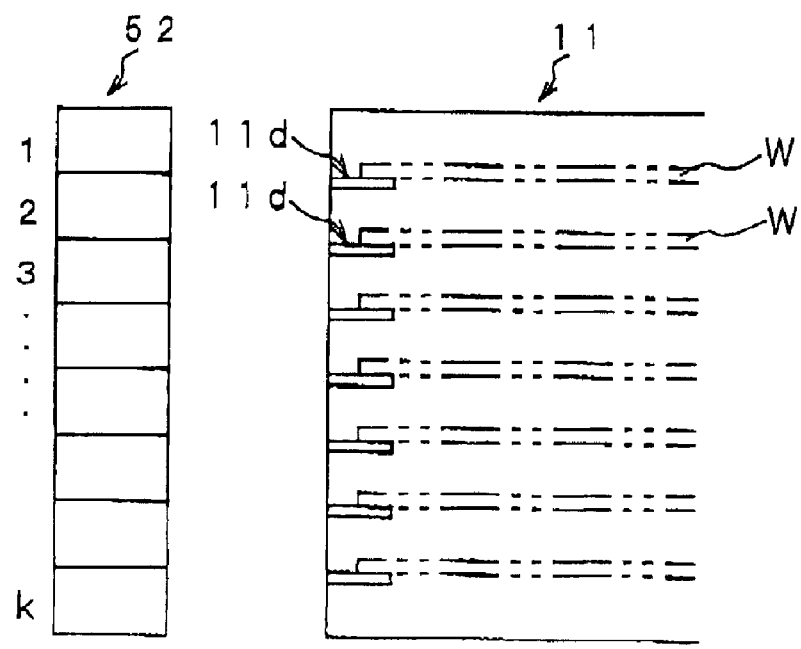

First, based on FIGS. 4A and 4B, a configuration for selecting a zone of a receiving element in the receiver 52 will be explained. In FIG. 4B, a situation of the receiver 52 that is fixed to a member 59 (not shown) that faces the access port 11c of the cassette 11 and provided with receiving elements (not shown) arranged serially along a height direction of the cassette 11 is schematically shown together with the cassette 11. The receiver 52 is a linear CCD camera in which substantially 2000 pieces of the receiving elements are arranged at a separation of, for instance, 30 mm. Accordingly, the linear CCD camera has a resolution power of substantially 0.01 mm. A thickness of a wafer W that is a detection target is usually in the range of substantially 0.7 to 0.8 mm, accordingly owing to the high resolution power of the linear CCD camera, an accommodation state of the wafer W can be accurately detected.

As shown FIG. 4B, the receiver 52 has a plurality of zones divided in a serial direction (in the drawing, a situation divided into k pieces of zones is shown). In each of the zones, a plurality of receiving elements (not shown) is arranged in a serial direction. A gate (not shown) that is opened based on the instruction of the CCD controller 65 is provided for each of the zones. Furthermore, each of the zones is divided into divisions so that each of the divisions may have a positional relationship that corresponds to each of the slots 11d of the cassette 11. Thereby, zone information described later can be obtained for each of the slots 11d. A pattern of the zone division is one example. A divided zone can be disposed so as to straddle each of the slots 11d, or a plurality zones may be assigned to each of the slots 11d. That is, various dividing pattern can be adopted.

In the next place, relationship between a position of the transmitter 51 in motion and the zone to be selected will be explained with reference to FIG. 4A. A vertical axis in FIG. 4A shows zone addresses (1 to k) of the CCD camera in a height direction of the cassette 11, and a horizontal axis shows a period of time elapsed from the start of the movement of the transmitter 51. A movement history in a height direction of the cassette 11 of the transmitter 51 is shown with an arrow mark (alpha) in the drawing. As understood from the drawing, the select controller 63, as the transmitter 51 descends, sequentially selects a zone of a position corresponding to a cassette height direction. Based on the selection result at the select controller 63, the CCD controller 65 opens a target gate, and thereby the signal transmitted from the transmitter 51 can be assuredly received over an entire height direction of the cassette 11. Furthermore, when a gate of a zone that does not correspond to a position of the transmitter 51 is closed, the noise or the like can be hindered from being wrongly received from a receiving element from which the signal is not required to receive, resulting in realizing a detector of higher accuracy.

Subsequently, with reference to FIGS. 5 and 6, a reception mode of the signals in each of the zones and a configuration for statistically processing the signal reception result in each of the zones and detecting the presence and the state of the wafer W will be explained.

Figure 5B:
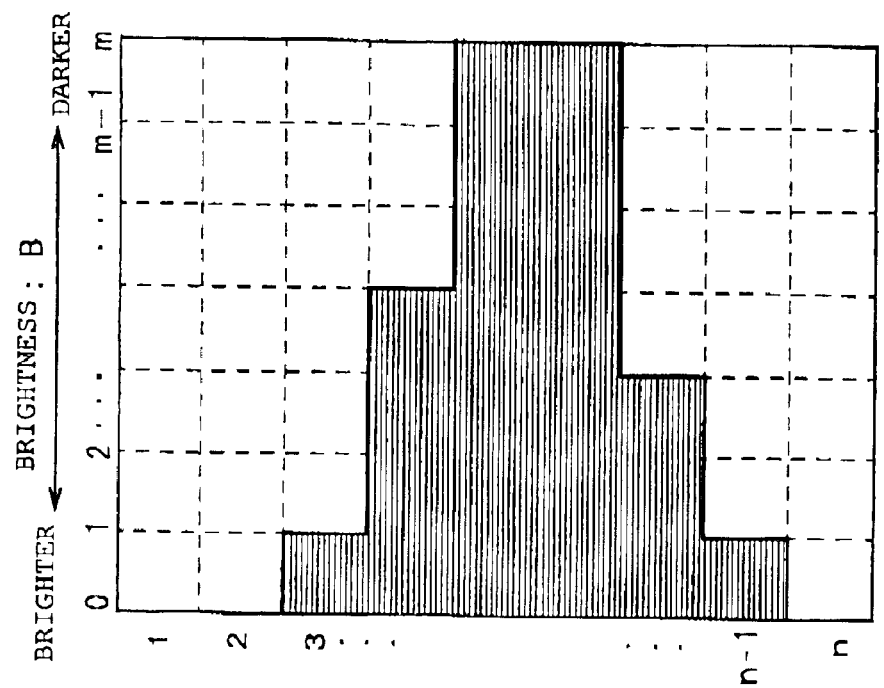
FIG. 5A is a diagram showing an arrangement of receiving elements in one zone, FIG. 5B being a diagram showing one example of reception results.
Figure 5A:
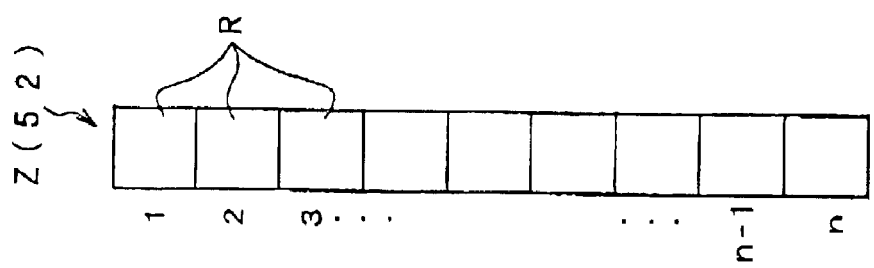

FIGS. 5A and 5B show an arrangement state of the receiving elements in one zone, and an example of the reception result. FIG. 5A shows one arbitrary zone Z in the receiver 52, and in the zone Z, a plurality of receiving elements R is serially arranged. In FIG. 5A, a situation where n pieces of the receiving elements R are arranged is illustrated (receiving element address 1 to n). Each of the receiving elements R receives a signal transmitted from the transmitter 51 (not shown) as far as the signal is not completely intercepted with the wafer W.

In FIG. 5B, an example of the reception results of signals in the zone Z is shown. The signals transmitted from the transmitter 51 are received with the respective receiving elements R, and in the receiving element R, a level (hereinafter referred to as "brightness B") of a magnitude (when the signal is a beam of light, an amount of light, that is, brightness) of a signal amount can be identified stepwise. In the present drawing, an example is shown in which according to a level of the darkness (scantiness of the signal amount), the brightness B is identified into (m+1) grades from level zero to level m. That is, in a state of level zero, a state in which the signal, in the middle of a signal passage from the transmitter 51 to the receiving element R, is not at all intercepted is shown. On the other hand, in a state of level m, a state in which the signal passage is completely intercepted in the middle thereof and the signal does not at all reach the receiving element R is shown. The states from level 1 to level (m−1) show ones where the signal passage is partially intercepted and the signal amount (in the case of the signal being a beam of light, an amount of light) diminishes.

When a wafer W is not present in a slot 11d thereto the zone Z corresponds, the brightness B of all receiving elements R becomes zero level, and when a wafer W is present, according to a position and state thereof (there may be a multi-slotted state or a cross slotted state), the brightness B varies up to the level m and thereby can be recognized.

As mentioned above, for each zone, a plurality of receiving elements R recognizes a signal reception state as a frequency distribution, and the reception result is transmitted through the CCD controller 65 to the select controller 63 and stored in the memory portion of the select controller 63. In the select controller 63, at the completion of reception of the reception results of all zones, according to the procedure of the processing shown in a flowchart of FIG. 6, the reception results are subjected to the detection of the presence and the accommodation state of the wafers W.

Figure 6:
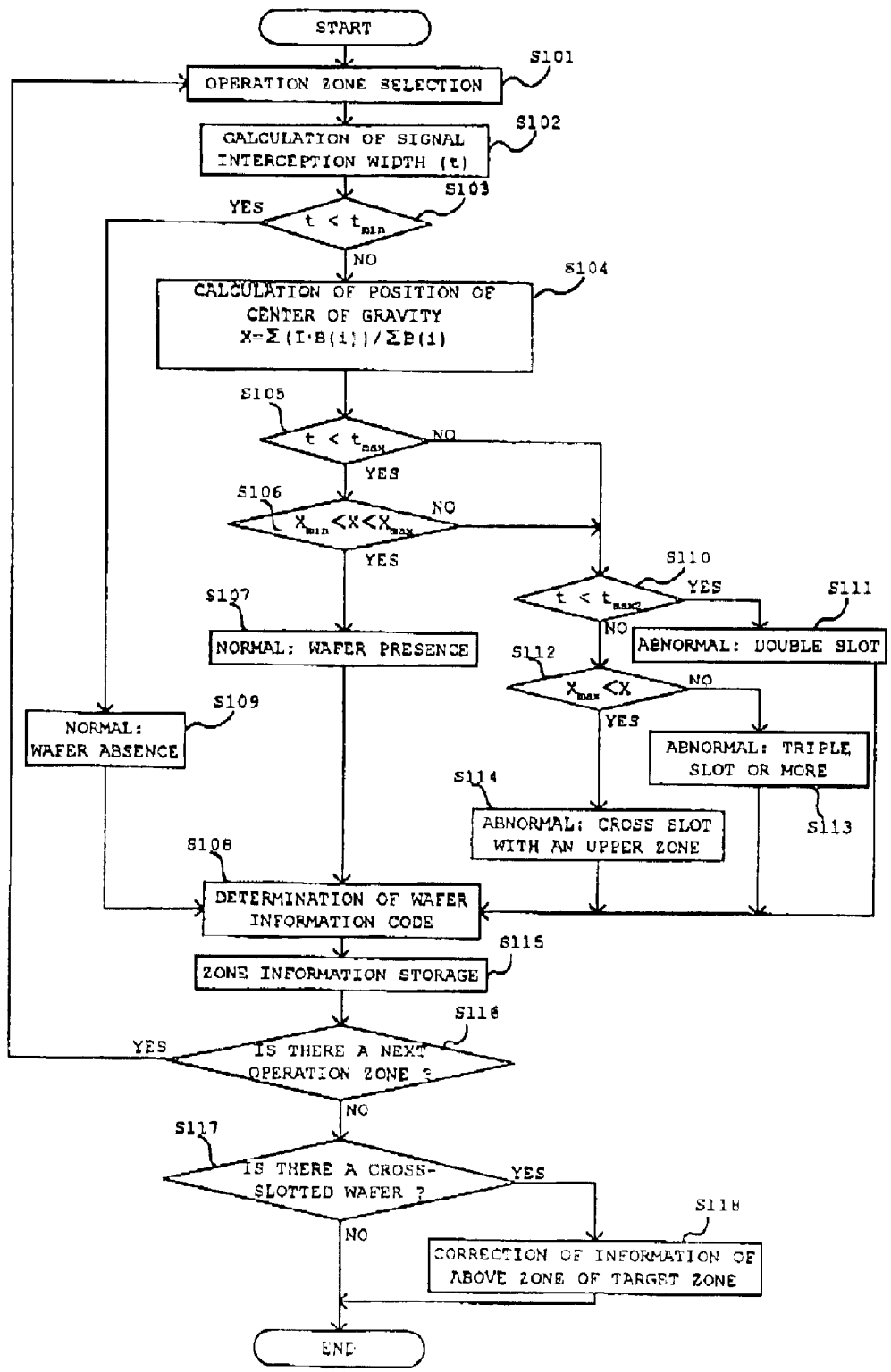
FIG. 6 is a flowchart showing a procedure with which the reception results are statistically processed, and thereby the presence or absence of a wafer in a cassette and a state thereof are detected.

The processing shown in FIG. 6 shows one example of an operation format of the select controller 63 that grasps the presence of the wafer W and the state thereof, and basically performs a statistical processing of the reception results for each zone.

In FIG. 6, when the processing is started, first, a zone Z corresponding to the uppermost slot 11d in a cassette height direction is selected (S101).

Subsequently, in the selected operation zone Z, a width (t) during which a signal is intercepted is calculated (S102). The calculation of the signal interception width t is performed by counting the number of the receiving elements R in a state where the brightness B is not in the level zero, for instance, in FIG. 5B. That is, in an example of FIG. 5, $t=\{(n-1)-2\}$ holds. The signal interception width t shows a region during which the signal is intercepted owing to the presence of the wafer W. The t is not necessarily calculated by counting the number of the receiving elements R of which levels are other than level zero, and, for instance, the counting maybe carried out by limiting to ones whose values of the levels of the brightness B exceed a definite value.

Thus, when the signal interception width t is calculated, whether the t is less than a preset value $t_{min}$ or not is judged (S103). According to this judgment, whether a wafer W is present in the calculated zone Z or not can be identified. That is, in the case of $t<t_{min}$, it is judged that a wafer W is not present in the slots 11d corresponding to the zone Z, and in the case of $t \geq t_{min}$, it is judged that a wafer W is present. At this time, a preset wafer information code is assigned to the operation zone Z (S109), and information that a wafer W is not accommodated in the zone Z is determined (S108). Although the value of the $t_{min}$ can be variously selected according to a thickness of the wafer W and possibility of receiving noise, it may be "zero".

Furthermore, in the step S103, when the wafer W is judged to be present ($t \geq t_{min}$), a position of center of gravity x of the signal interception width t is calculated (S104). Here, the position of center of gravity x is a center position that is calculated in consideration of the frequency distribution of the brightness B of the respective receiving elements R in the zone Z, and corresponds to a position of center of gravity in a cassette height direction of the wafer W present in the zone Z. The position of center of gravity x is quantified with receiving element addresses (1 to n) by use of the following equation (1).

$$X = \sum_i (i \times B(i)) \bigg/ \sum_i B(i) \qquad i = 1 \text{ to } n. \tag{1}$$

In the above equation, 1 denotes a receiving element address, and B(i) denotes a brightness level at the receiving element address i.

According to the equation (1), the position of center of gravity x in the zone Z can be calculated.

When the calculation of the position of center of gravity x has come to completion, once more, whether the value of the signal interception width t is in the preset range or not is judged (S105). In the case of $t<t_{max}$, it is judged that there is a possibility of only one wafer W being properly accommodated in a slot 11d. In the case of $t_{max} \leq t$, it is judged that the wafer W is accommodated improperly in a slot 11d (multi-slotted state or cross-slotted state). The value of $t_{max}$ is preferable to be properly determined in consideration of the dispersion when a thickness of one wafer W is detected.

In the case of $t<t_{max}$, whether the position of center of gravity x is within a preset range or not is further judged (S106). In the case of $x_{min}<x<x_{max}$, it is judged that the number of the wafer W is one and the wafer W is properly accommodated (S107). In this case, a preset wafer information code is assigned to the operation zone Z, and it is determined that the wafer W is properly accommodated in the zone Z (S108). Here, the values of $x_{min}$ and $x_{max}$ too, similarly to the determination of the value of $t_{max}$, are necessary to be properly set in consideration of the dispersion at the detection. When the position of center of gravity x is not present in the range of more than $x_{min}$ and less than $x_{max}$, it is judged that the wafer W is improperly accommodated in the slot 11d.

When, in the step S105 or step S106, it is judged that the wafer W is improperly accommodated, whether t is less than $t_{max2}$ or not is further judged (S110). The $t_{max2}$ is a value that is set in consideration of the dispersion of the detection value in the case of double slotted state. When the signal interception width t is less than the $t_{max2}$, it is judged that the double slot has occurred (S111), and a wafer information code is determined (S108).

When the t is $t_{max2}$ or more, whether the position of center of gravity x exceeds $x_{max}$ or not is further judged (S112). When the x exceeds $x_{max}$, it is judged that the wafer W is in a cross slot state with an upper zone (S114), when the x is $x_{max}$ or less, it is judged that the wafers W are triply slotted or more (S113), and wafer information codes are determined according to the respective cases (S108).

When the wafer information code of the operation zone Z is determined (S108), the information is stored in the memory portion of the select controller 63 as information of the zone (S115). When there is a next operation zone Z, the above processes (S101 to S115) are repeated until the statistical processing is completed for all operation zones Z (S116).

When the statistical processing has come to completion for all operation zones Z, with all zones Z as a target, the zones where the wafer information code of cross-slotted irregularity is stored are searched (S117). When it is identified that the cross slot has occurred in any of the zones, zone information of an upper zone of the zone is corrected as an upper side of the cross slot and stored.

According to the above, for all slots 11d in the cassette 11, the accommodation state of the wafer W can be accurately detected, and even an improper wafer accommodation state such as a multi-slotted state or a cross slotted state can be accurately grasped.

In the wafer mapping system 1, when an arrangement density of the receiving elements R that are serially arranged is properly selected, even the improper wafer accommodation state such as multi-slotted or a cross slotted state can be accurately detected. Furthermore, in the wafer mapping system 1, when a plurality of receiving elements R is used to improve the resolution power of detection signal, and the statistical processing is applied based on the information obtained from the reception results of the plurality of receiving elements, even the improper wafer accommodation state such as a multi-slotted or cross slotted state can be accurately identified.

In the next place, operations of the wafer mapping system 1 according to the first embodiment will be explained with the explanations of the above-mentioned portions appropriately omitted. First, in FIG. 3, the cassette 11 transferred by means of a not shown transfer system is placed on the cassette stage 12 of the susceptor 3. After the placement, the cassette 11 is forward-driven by use of the cassette driver 4. At this time, the shutter 15a is clogging the passage 10a. When the cassette 11 is forward-driven to a position in proximity to the shutter 15a, a not shown lock mechanism disposed to the shutter 15a engages with the pinion 11g of the fixing mechanism 11e disposed to the lid 11b of the cassette 11, and thereby the fixing mechanism 11e is unlocked (FIG. 8). Thereby, the lid 11b can be removed from the housing 11a and the lid 11b is held by the shutter 15a.

Subsequently, the shutter 15a is retracted by use of a shutter forward and backward movement mechanism 15d. When the shutter 15a is retracted, the access port 11c of the cassette 11 is opened and a space is generated between the shutter 15a that holds the lid 11b and the cassette 11.

Referring to FIG. 1A, the shutter 15a in a state after it is retracted is shown, and the arm 53 before it is gyrated and wobbled with the air cylinder 56 and the rod 57 is shown with a solid line in the drawing. From this state, when the rod 57 proceeds forward relative to the air cylinder 56, the arm 53 is allowed wobbling through the link members (55a, 55b) and the wobble shaft 54 up to a position of a chain double-dashed line, and thereby the transmitter 51 attached to one end 53a of the arm 53 proceeds into the cassette 11.

When the transmitter 51 proceeds into the cassette 11, the transmitter 51 transmits a signal to the receiver 52. Then, the shutter 15a is lowered by means of the elevator 15c of the shutter driver 15, and the scanning is performed between the transmitter 51 and the receiver 52. The signal passage is intercepted at a position where a wafer W is present. At a position where a wafer W is not present, since the signal passage is not intercepted, the signal reaches the receiver 52 and is received there.

As the transmitter 51 is lowered, a gate of a zone of the receiver 52 corresponding to a position of the transmitter 51 in motion is sequentially opened, and as mentioned above, for each of the zones the signal reception results expressed in the frequency distribution can be obtained (FIGS. 4 and 5).

When the shutter 15a is lowered and the transmitter 51 goes past the slot 11d in the lowermost tier of the cassette 11, in the select controller 63 that has received the transmission of the signal reception results of all zones, as mentioned above, the signal reception results are statistically processed for each of the zones. The select controller 63 determines a wafer information code for each of the zones and transmits the information to the loader module 62. In the loader module 62, for each cassette, the information is stored in the memory portion 62b (FIGS. 6 and 2). The water accommodation information is utilized when, for instance, when wafers W accommodated in the cassette 11 are processed at the process portion 19 of the wafer processor 50, a wafer W in a particular slot 11d of the cassette 11 is taken out, and the wafer W, after the processing, is returned to the particular slot 11d therefrom it is taken out to accommodate therein.

In the cassette 11, upon completion of the signal transmission for detecting a wafer W, the arm 53 retreats again from a state projected to the passage 10a to a state shown with a solid line in FIG. 1.

In the above, the wafer mapping system 1 according to the first embodiment is explained. According to the wafer mapping system 1, with a simple system configuration, a high precision wafer mapping system capable of accurately detecting an accommodation state of wafers in a FOUP cassette can be obtained.

Furthermore, the first embodiment, without restricting to the above-mentioned, can be implemented by modifying as follows, for instance.

(1) In the wafer mapping system 1, an embodiment where a gate is opened for each of the zones, and in concerting with a movement of the transmitter 51 a signal is sequentially received is shown. The present invention is not necessarily restricted to the above. For instance, without disposing a gate, during the movement of the transmitter 51, all the receiving elements R may be left in a receivable state.

(2) In the wafer mapping system 1, the transmitter 51 is attached to the shutter 15a. However, even when the transmitter 51 is attached to an elevator disposed separately from the shutter driver 15, an effect similar to the present invention can be obtained.

(3) In the wafer mapping system 1, to the arm 53 one end of which is attached in a freely wobbling manner to the shutter 15a, the transmitter 51 is attached. However, there is no need of implementing like this. For instance, the transmitter 51 may be attached to a tip end of a member that proceeds vertically from an upper portion of the shutter 15a to the inside of the cassette 11.

(4) In the wafer mapping system 1, the receiver 52 is attached to the member 59 that is extended in parallel with the separation wall 10. However, the receiver 52 may be integrally attached to the separation wall 10.

(5) In the wafer mapping system 1, the signal passage that is formed between the transmitter 51 and the receiver 52 is intercepted with the wafer W, and thereby an accommodation state of a wafer W is detected. However, there is no need of carrying out like this. For instance, by receiving a signal reflected from a circumferential side surface of the wafer W with a receiver, the presence of the water W may be detected.

(6) In the water mapping system 1, an example in which as the statistical processing for detecting the wafer accommodation state, the signal interception width and the position of center of gravity are calculated to detect the accommodation state is shown. There is no need of carrying out like this. For instance, only the signal interception width or the position of center of gravity may be calculated to judge. Furthermore, the logic for calculating the position of center of gravity too, without restricting to that of the present embodiment, can accomplish an effect similar to the present invention.

(7) In the wafer mapping system 1, as the receiver 52 the linear CCD camera is illustrated. However, there is no need of carrying out like this. For instance, end surfaces of a plurality of optical fibers may be serially arranged.

(Second Embodiment)

In the next place, a wafer mapping system 2 according to a second embodiment of the present invention will be explained.

Figure 7A:
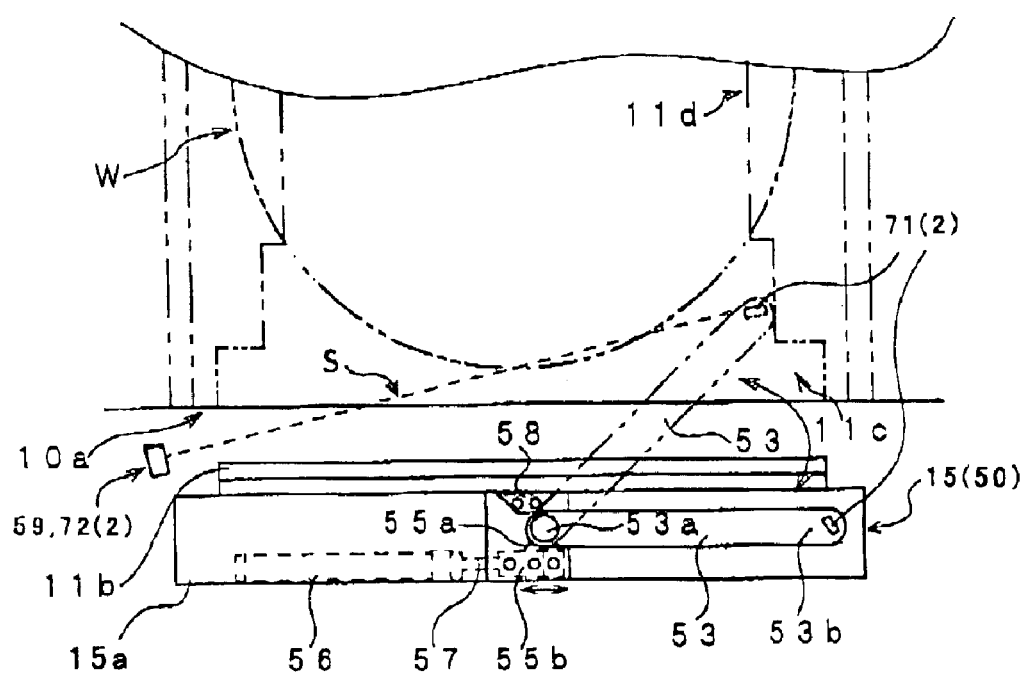
FIGS. 7A and 7B are drawings showing a state where a wafer mapping system according to a second embodiment of the present invention is attached to a wafer processor, FIG. 7A being a top view thereof, FIG. 7B being a side view seen from a wafer processor side.
Figure 7B:
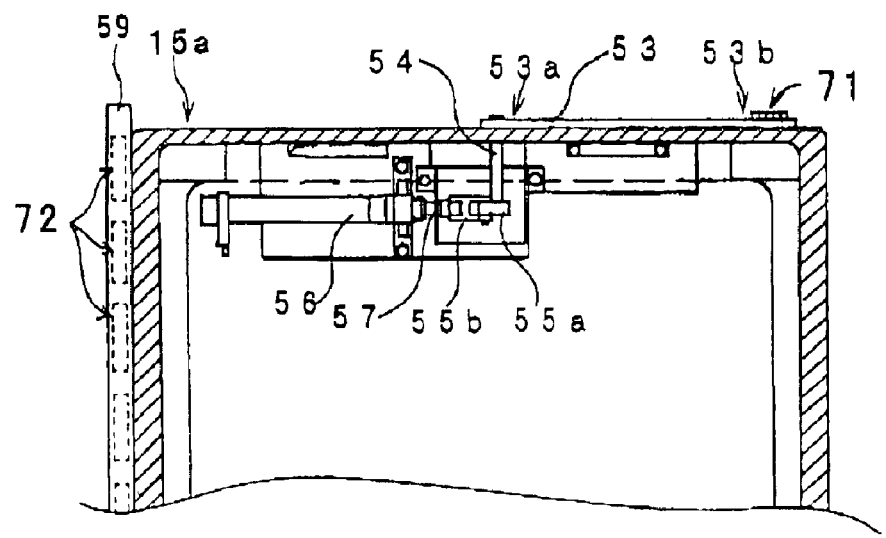

FIG. 7 shows a situation where a wafer mapping system 2 is attached to part of a wafer processor 50, FIG. 7A being a top view, FIG. 7B being a side view seen from a wafer processor side. FIG. 8 is a schematic diagram showing a control system of the wafer mapping system 2. The wafer mapping system 2, similarly to the wafer mapping system 1 according to the first embodiment, is used in the wafer processor 50 shown in FIG. 3. Furthermore, in FIGS. 7 and 8, portions similar to those of the first embodiment are given the same reference numerals. In the following, portions redundant with the wafer mapping system 1 according to the first embodiment will be appropriately omitted from explaining.

The wafer mapping system 2 includes a transmitter 71 that emits a beam (beam of light) that is a signal and a plurality of receivers 72 that receives the signal transmitted from the transmitter 71. The transmitter 71, similarly to the case of the wafer mapping system 1, is attached through an arm 53 to a shutter driver 15. The arm 53 is attached in a freely wobbling manner to an upper portion of the shutter 15a at one end 53a thereof, and at the other end 53b thereof the transmitter 71 is attached.

The transmitter 71 is configured so that, after the arm 53 gyrates and wobbles and proceeds to an access port 11c of a cassette 11, the transmitter 71 transmits a signal (beam of light) to a wafer W accommodated in each of slots 11d of the cassette 11, and the receiver 72 can receive the signal. When a signal passage S from the transmitter 71 to the receiver 72 is intercepted with the wafer W, the presence and the state of the wafer W can be detected. As the transmitter 71, an LD (laser diode), an LED (light emitting diode) and so on can be used.

Furthermore, a configuration of a mechanism that gyrates and wobbles the arm 53 thereto the transmitter 71 is attached and an effect thereof are similar to those of the case of the wafer mapping system 1.

Figure 9:
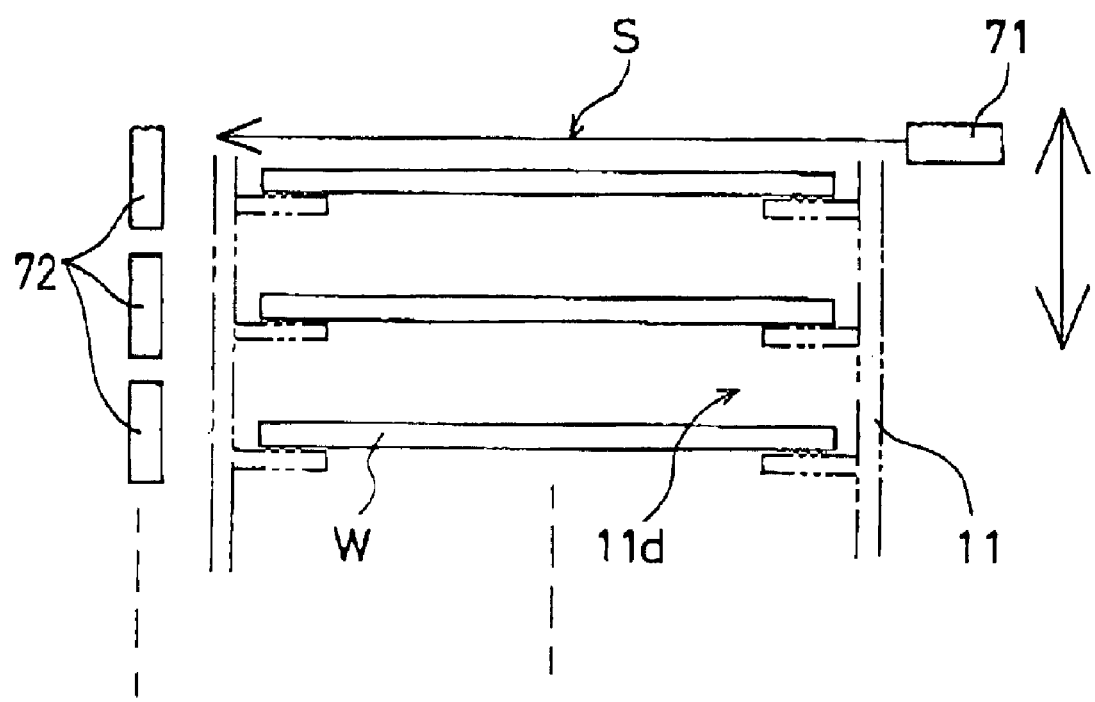
FIG. 9 is a schematic diagram showing a situation where a plurality of receivers is serially arranged along a height direction of a wafer cassette.

Subsequently, the receiver 72 will be explained. As shown in FIG. 7, the receiver 72 is attached to a member 59. The member 59, when the cassette 11 is placed on a cassette stage 12 and the access port 11c of the cassette 11 faces a passage 10a of a separation wall 10, is located so as to face the access port 11c (FIGS. 3 and 7), and the receiver 72 is attached to the member 59. The plurality of receivers 72 is serially arranged along a height direction of the cassette 11. A situation where the plurality of receivers 72 is serially arranged is schematically shown in FIGS. 8 and 9. As shown in the drawings, in the plurality of receivers 72, each of the receivers 72 is arranged so as to correspond to each of the slots 11d of the cassette 11. Thereby, when each of the receivers 72 receives a signal transmitted from the transmitter 71 that is traveling up and down (movement in an arrow mark direction in the drawing) (FIG. 9), the accommodation state of a wafer W in each of the slots 11d can be identified. As the receiver 72, a PD (photo diode), a PSD (position sensitive detector) and a CCD (charge coupled device) can be used. When the PSD or the CCD is used as an element for use in the receiver, an incidence position of a light beam in the receiver can be detected.

In the following, in the second embodiment, an example where the PSD element is used as the receiver 72 will be explained.

Figure 10:
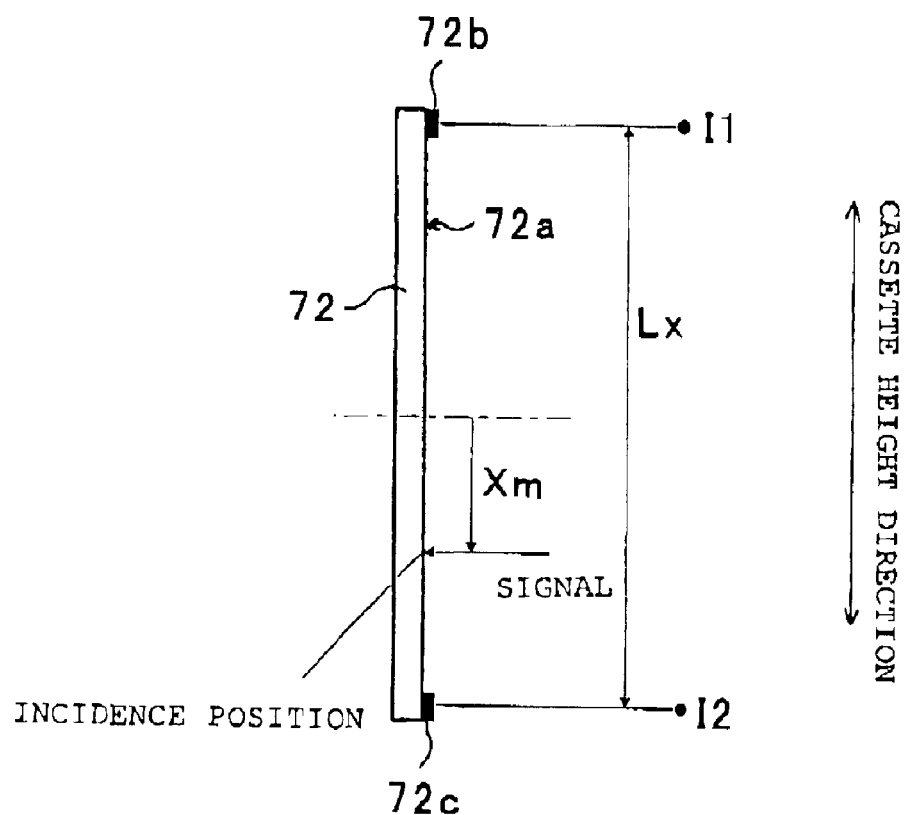
FIG. 10 is a diagrammatic representation for explaining a configuration of a PSD element that is a receiver.

FIG. 10 is a diagrammatic representation for explaining a configuration of a receiver 72 that is constituted of a PSD element (hereinafter referred to as "PSD 72"). In the PSD 72, at both ends of a light receiving surface 72a, electrodes 72b and 72c are formed. From the electrodes (72b, 72c), respectively, electrode signals I1, I2 inversely proportional to distances between an incidence position of a signal (beam of light) and the electrodes are outputted. In FIG. 10, a case where a signal is incident on a position a distance Xm apart downward from a center position in a cassette height direction of the PSD 72 is illustrated.

In the PSD 72, a sum of I1 and I2 (I=I1+I2) is proportional to an intensity of the incident light (intensity of a beam of light). A position of incidence Xm can be obtained according to the following equation (2).

$$Xm = (I2-I1)/(I1+I2) \times (Lx/2) \qquad (2)$$

In the above, Lx is an element length (a distance between the electrode 72b and the electrode 72c) of the PSD 72.

Accordingly, the receiver 72 can detect an intensity of a received signal and a reception position where the receiver 72 receives the signal in the receiver 72. The receiver 72 can output an intensity output I corresponding to the intensity of the signal received at the receiver 72 and a positional output Xm corresponding to the position where the signal is received. Alternatively, the receiver 72 can output information (electrode signals I1 and I2) that allows calculating the intensity output I and the positional output Xm.

As mentioned above, in the wafer mapping system 2, a plurality of receivers 72 is serially attached to the member 59 that faces the access port 11c of the cassette 11, and only the transmitter 71 moves up and down to detect a wafer W. Accordingly, the signal transmitted from the transmitter 71 can be stably received at the receiver 72, and an accommodation state of the wafers W in the cassette 11 can be accurately detected. Furthermore, since what moves up and down is only the transmitter 71 and furthermore it moves attached to the shutter 15a, the mechanism of the wafer mapping system can be simplified. By serially arranging a plurality of receivers 72, without needless inconvenience of fabricating an integrated long receiver, the wafer mapping system that moves up and down only the transmitter 71 to detect a wafer W can be simply realized.

Furthermore, since each of the receivers 72 is disposed so as to correspond to each of the slots 11d of the cassette 11, the accommodation state of a wafer W in each of the slots 11d can be accurately detected and a plurality of receivers 72 can be laconically and effectively arranged.

When a signal passage S that is formed between the transmitter 71 that has proceeded into the cassette 11 and the serially arranged receiver 72 is intercepted by the wafer W, the wafer W is detected. Accordingly, the detection of the wafer W can be assuredly and accurately performed.

Furthermore, the transmitter 71 is attached to the shutter driver 15, and when the shutter driver 15 moves up and down, a wafer W is detected. Accordingly, the wafer W can be speedily detected. Since there is no need of separately disposing a mechanism for moving up and down the transmitter 71, the wafer mapping system can be simplified in its mechanism.

In the next place, a control system for detecting a wafer W with the wafer mapping system 2 will be explained with reference to FIG. 8. FIG. 8 schematically shows relationship between the transmitter 71, the receiver 72, the wafer W, the shutter 15a and the support member thereof 15b, the screw shaft 61 and the stepping motor 60. The transmitter 71 is moved up and down with the stepping motor 60 and the screw shaft 61 through the shutter 15a and the support member 15b.

In FIG. 8, the wafer mapping system 2 includes a receiver controller 73, a transmitter movement controller 74, a transmitter controller 75 and a wafer detection module 76. The receiver controller 73 performs processing or the like of signals received at the receiver 72 (PSD 72). The transmitter movement controller 74 controls the stepping motor 60 and thereby controls a movement position of the transmitter 71 (hereinafter referred to also as "LD 71"). The transmitter controller 75 performs on-off switching of a beam irradiated from the LD 71 and controls an output thereof. The wafer detection module 76 is communicatably connected to the respective controllers (73, 74, 75) and grasps the accommodation state of a wafer W in each of the slots 11d.

First, in the wafer detection module 76, at the timing when the forward and backward movement mechanism 15d of the shutter driver 15 makes the shutter 15a retreat and the lid 11b of the cassette 11 is removed (FIG. 3), a switching instruction is transmitted to an electromagnetic valve 66 to switch a compressed air to the air cylinder 56. Thereby, the rod 57 advances relative to the air cylinder 56 and the LD 71 advances into the cassette 11 (FIG. 7).

When the arm 53 is gyrated and the LD 71 is advanced into the cassette 11, the wafer detection module 76 transmits a pulse instruction to the transmitter movement controller 74 and a beam irradiation instruction to the transmitter controller 75. Thereby, a beam (signal) is irradiated from the LD 71. The transmitter movement controller 74, according to the received pulse instruction, rotates the stepping motor 60. As the motor 60 rotates, the screw shaft 61 rotates, and the LD 71 starts descending together with the shutter 15a.

As the LD 71 is lowered, the beam emitted from the LD 71 is sequentially received at the respective PSDs 72. At this time, when a wafer W is accommodated in each of the slots 11d of the cassette 11, in a portion where the wafer W is present, the passage S (signal passage) of the beam from the LD 71 to the PSD 72 is intercepted. A receiver output (PSD output) due to a signal received at the PSD 72 is transmitted to the wafer detection module 76 by means of the receiver controller 73.

The receiver controller 73 receives the electrode signals I1 and I2 from each of the PSDs 72 and calculates an intensity output I that is a sum of the electrode signals I1 and I2, and a positional output Xm that can be obtained from the equation (2). Then, the receiver controller 73 transmits the intensity output I and the positional output Xm to the wafer detection module 76. Accordingly, as the receiver output (PSD output), the intensity output I and the positional output Xm are transmitted from the receiver controller 73 to the wafer detection module 76. The receiver controller 73, without calculating the positional output Xm, may calculate the intensity output I only, and as the receiver output the intensity output I only may be transmitted to the wafer detection module 76.

Figure 11:
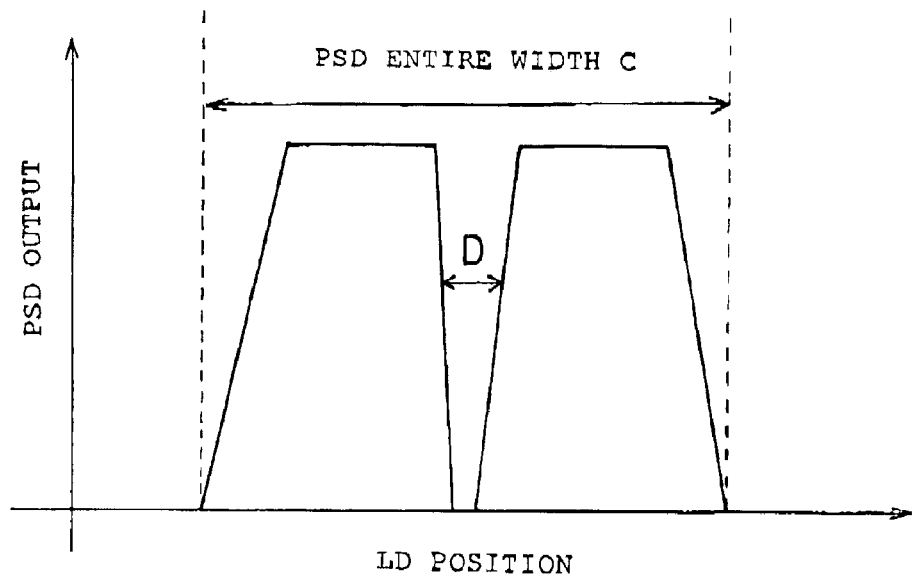
FIG. 11 is a diagram showing a distribution of a receiver output detected when a wafer is properly accommodated in a slot of the cassette.

The wafer detection module 76, based on the obtained PSD outputs, calculates a distribution of the PSD outputs counted in accordance with positions of the LD 71 in motion along a height direction of the cassette 11 (that is, in accordance with the pulse instruction) for each of the PSDs 72 (that is, for each of the slots 11d of the cassette 11). FIG. 11 shows a distribution of the PSD output in each of the PSDs 72 that is detected when the wafer W is properly accommodated in each of the slots 11d. In FIG. 11, as the PSD output distribution, a distribution of the intensity output I is shown. When a wafer W is properly accommodated, as shown in FIG. 11, relationship between the PSD output (vertical axis) as the intensity output I and the position of the LD 71 (horizontal axis) can be obtained as a linear array type output distribution. A reception signal entire width C (hereinafter referred to also as "PSD entire width C" or "entire width C") corresponding to a distribution length of the PSD output (intensity output I) can be calculated. Furthermore, a reception signal interception width D (hereinafter referred to also as "interception width D" or "light interception width D") corresponding to a length of a portion where the beam is not received in the entire PSD width C because the signal passage S to the PSD 72 is intercepted by the wafer W can be calculated. When a wafer W is not accommodated in the slot 11d, the interception width D is not generated.

Figure 12:
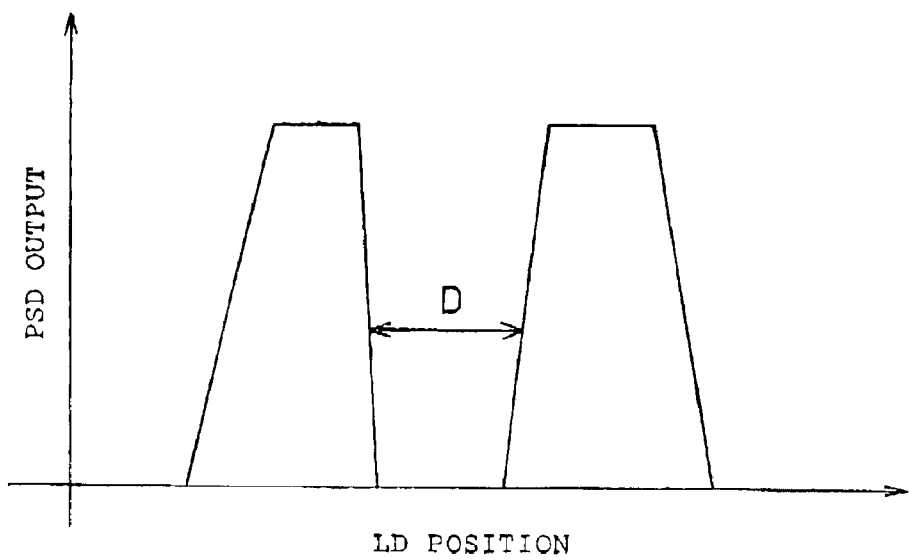
FIG. 12 is a diagram showing a distribution of a receiver output detected when wafers are accommodated in a multi-slotted state in a slot of the cassette.

Since a value of the interception width D is determined based on a thickness of the wafer W, in a state where a plurality of wafers is accommodated in a slot 11d in a multi-slotted state, as shown in FIG. 12, the interception width D is obtained in a state more expanded than the proper state (FIG. 11). Eased on a value of the expanded interception width D, the wafer detection module 76 can identify the number of the wafers W accommodated in the same slot 11d. That is, the wafer detection module 76, by comparing a preset threshold value Dv (hereinafter referred to as "known wafer width Dv") determined in advance based on a dimension of the wafer W (thickness of a wafer W) and so on and the calculated interception width D, can identify and detect a state where the wafers W are accommodated in a slot 11d in a multi-slotted state.

Figure 13:
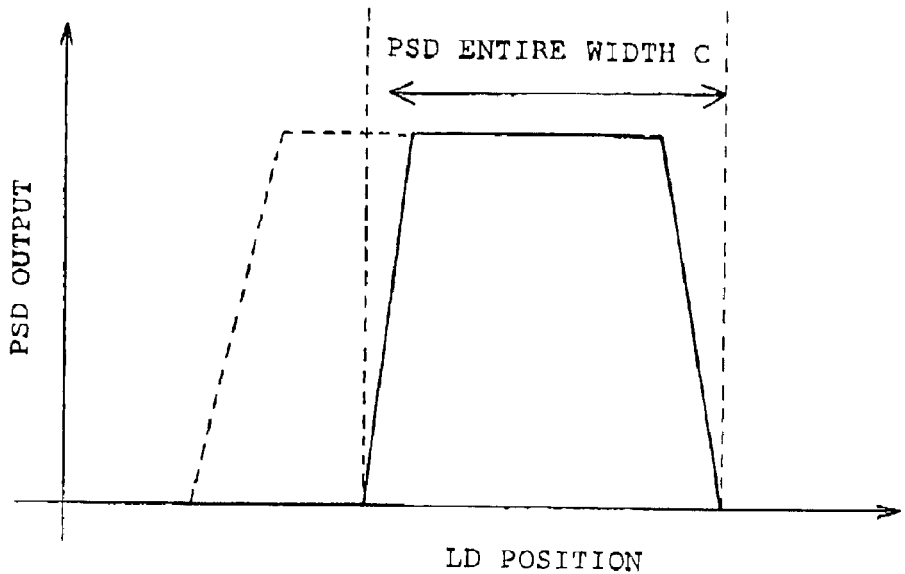
FIG. 13 is a diagram showing a distribution of a receiver output detected when a wafer is accommodated in a cross-slotted state in slots of the cassette.

Furthermore, in a state where a wafer W is accommodated in a cross slot state, as shown in FIG. 13, an entire width C is calculated as a narrower one than in the proper state (FIG. 11) (in FIG. 13, a portion that is narrower than a proper entire width C is shown with a dotted line). Based on a value of the narrowed entire width C, the wafer detection module 76 can identify a state of the cross slot. That is, the wafer detection module 76 compares a preset threshold value Cv (hereinafter referred to also as "known PSD width Cv") that is determined in advance based on a dimension of a signal receivable width (the maximum width of the PSD output distribution; in a state where a wafer W is properly accommodated, it coincides substantially with a value of the PSD entire width C) in each of the PSDs 72 and an entire width C calculated as a length of the obtained PSD output distribution. When there is no change detected between the value of the entire width C and the value of the known PSD width Cv, the wafer detection module 76 judges that the wafer W is not accommodated in a cross slot state. Thus, the wafer detection module 76, by comparing the known PSD width Cv and the entire width C, can identify and detect a state where a wafer W is accommodated in a cross slot state.

Figure 14:
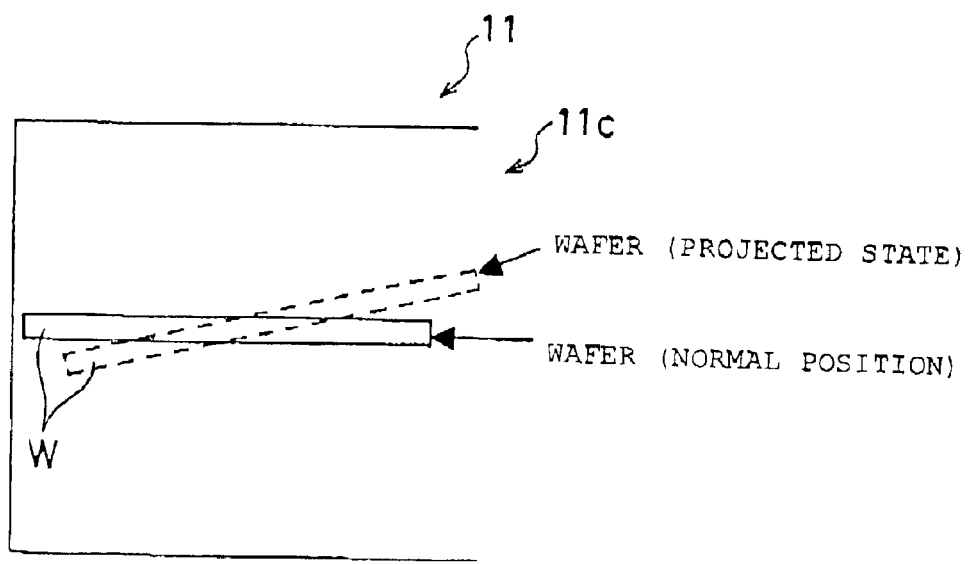
FIG. 14 is a diagram for explaining a state where a wafer comes, as if projecting, out of a slot of the cassette toward an access port and a little tilts (projected state)

By an operation when the lid 11b of the cassette 11 is opened with the shutter 15b, in some cases, a state where a wafer W, as if flying out of each of the slots 11d of the cassette 11 toward the access port 11c, deviates and slightly tilts occurs. That is, as shown in FIG. 14, there may occur a state where a wafer W is accommodated tilted in a state a little projected toward the access port 11c (from a proper position shown with a solid line to a projected state shown with a dotted line). However, when the wafer W, though accommodated in the projected state like this, can be taken out with a wafer transfer device 8 (FIG. 3), it maybe identified as a proper accommodation state.

Figure 15A:
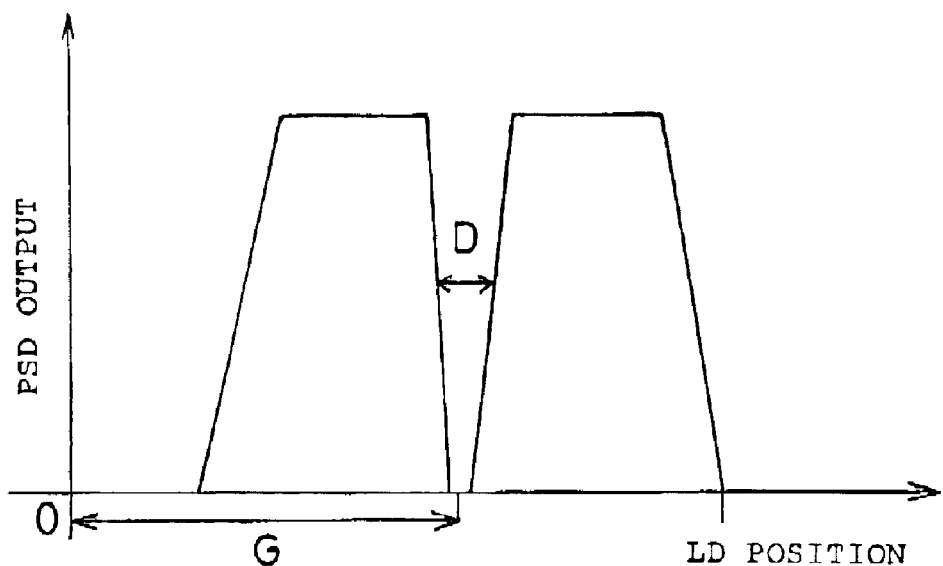
FIG. 15A is a diagram showing a distribution of a receiver output that is detected when a wafer is properly accommodated in a slot of the wafer cassette and FIG. 15B is a diagram showing a distribution of a receiver output that is detected when a wafer is accommodated in a projected state in a slot of the wafer cassette.
Figure 15B:
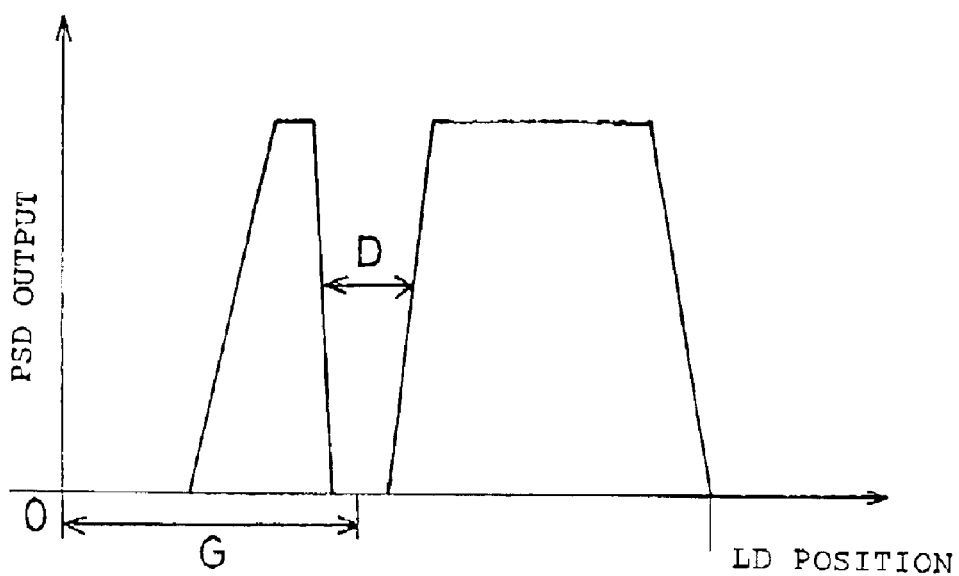

When a wafer W is in a proper position in FIG. 15, a PSD output distribution having a waveform as shown in FIG. 15A is always obtained, and a value of the interception width D does not substantially vary and becomes substantially the same value. Furthermore, in this case, also a position where the interception width D is in the entire width C (in FIG. 15, a position G where a center of the interception width D obtained from a preset reference point O is) does not substantially vary and is always at substantially the same position. However, when a wafer W is in a projected state in FIG. 14, a PSD output distribution having a waveform as shown in FIG. 15B is obtained. That is, in the case of the projected state, a position G where the center of the interception width D is present deviates from the proper position and a width of the interception width D also changes from that of the case in the proper position.

It is preferable to accurately detect even in a delicate accommodation state such as that a wafer W, though accommodated a little tilted, maybe identified to be in a proper accommodation state. Accordingly, in the wafer detection module 76, in addition to the above-mentioned reception signal entire width C and the reception signal interception width D, a reception signal interception position G corresponding to a position where the center of the interception width D is present in the entire width C is calculated. Subsequently, the above-mentioned preset threshold value (known wafer width) Dv is set based on a dimension of a wafer W and the calculated interception position G, and the known wafer width Dv set according to the interception position G and the interception width D are compared. Thereby, even when the PSD output distribution as shown in FIG. 15B is obtained, the wafer detection module 76 can identify that the wafer W is in a projected state. As a specific example of setting the known wafer width Dv according to the interception width G, for instance, as shown in the following equation, a method in which the known wafer width Dv is changed and set in proportion to the interception position G can be used.

Known wafer width Dv=K1×interception position G+K2

(here, K1 and K2 are constants set according to a positional relationship between each of the slots 11d and a corresponding PSD 72).

In the above, the known wafer width Dv may be set, not as a linear expression of the interception position G, as a quadratic expression thereof or as a table value according to a value of the interception position G. That is, various methods can be selected to use.

Figure 16:
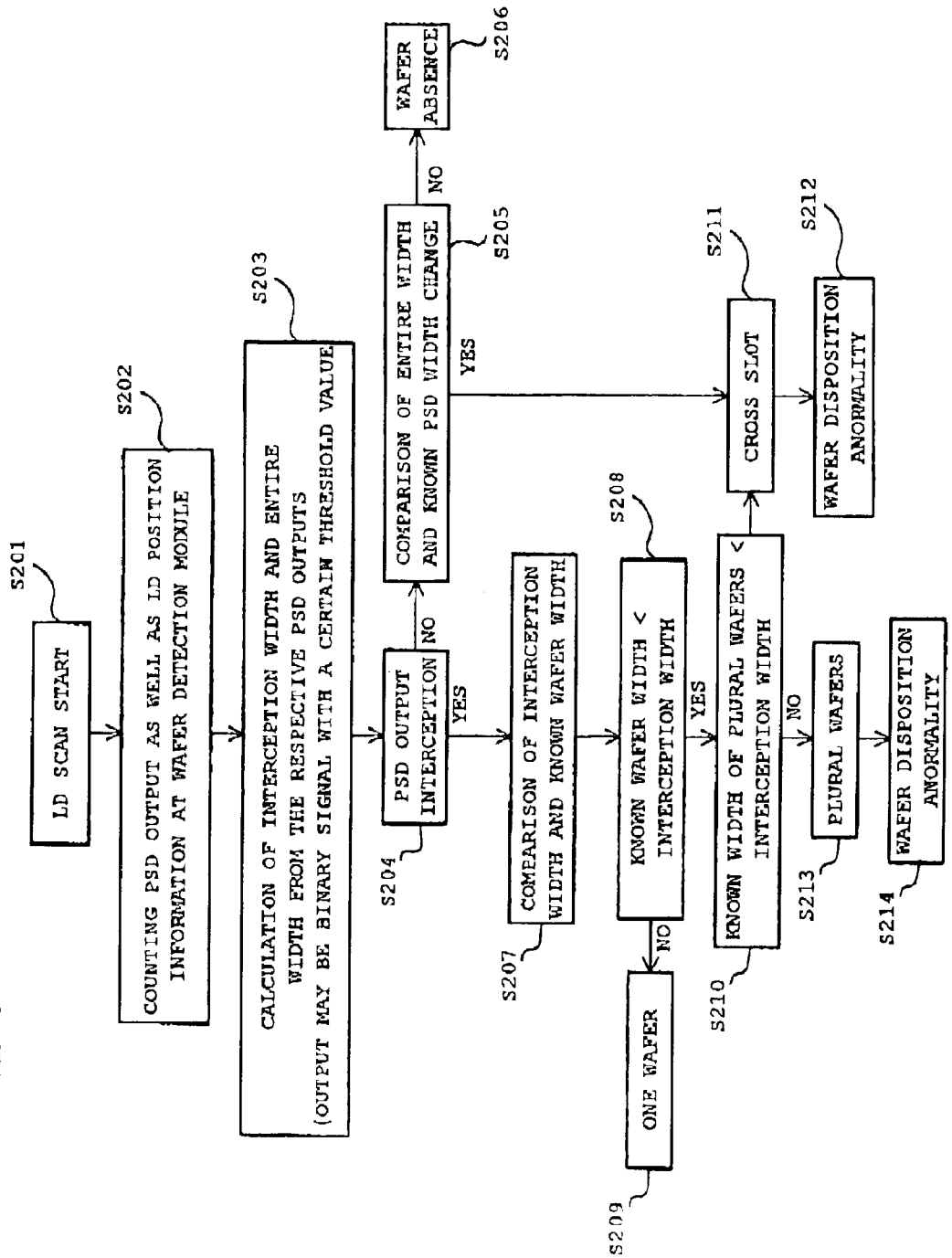
FIG. 16 is a diagram for explaining a procedure of the processing for detecting a wafer accommodation state.

Subsequently, with reference to FIG. 16, a procedure of the processing for detecting an accommodation state of a wafer W according to the wafer mapping system 2 will be explained. First, with a beam emitting from a LD 71, the LD 71 starts descending and begins scanning a wafer W (S201). In the PSD 72, the beam emitted from the LD 71 is received at a portion where a wafer W is not present, and the received PSD output is transmitted to the wafer detection module 76. The wafer detection module 76 counts the PSD output together with positional information of the LD 72 (pulse instruction of the stepping motor 60) (S202).

In the wafer detection module 76, as mentioned above, based on the PSD output, the interception width D (light interception width D) and the entire width C are calculated for each of the PSDs 72 (S203). At this time, the PSD output may be processed as a binary signal that is obtained by judging with a preset threshold value as a boundary. For each of the PSD outputs, whether light interception is present or not in the entire width C (that is, whether the interception width D can be calculated or not as a value that is not zero) is judged (S204). When there is no light interception in the PSD output that is a judgment target, the entire width C and the known PSD width Cv are further compared (S205). When the value of the entire width C is not different from the known PSD width Cv, it is identified that a wafer W is not present in the slot 11d corresponding to the PSD output (S206). When there is a change, as explained with reference to FIG. 13, it is identified to be in a cross-slotted state (S211).

Furthermore, in step S204, when it is identified that there is the interception in the entire width C (in the case of the interception width D being calculated), the interception width D is compared with the known wafer width Dv (S207). In the comparison, a value of the interception width D and that of the known wafer width Dv are compared in their magnitudes (S208), and when the interception width D is smaller than the known wafer width Dv it is identified that one wafer W is accommodated (that is, the wafer W is properly accommodated) in the slot 11d corresponding to the PSD output (S209). As a value of the known wafer width Dv, a value that can identify a dimension that is larger than a thickness of one wafer and smaller than a thickness of two wafers is set. Furthermore, as mentioned above, as the known wafer width Dv, when the value thereof is set based on the interception position G, a projected but proper accommodation state (FIG. 14) can be detected.

In the step S208, when the interception width D is larger than the known wafer width Dv, whether a plurality of the wafers W is accommodated or not in the slot 11d corresponding to the PSD output, or whether it is cross-slotted or not is further identified (S210). In the step S205, a cross-slotted state is detected by identifying a change in the entire width C. However, depending on factors such as a position of the wafer W, a length of a portion (dead zone) where a PSD is not arranged between adjacent PSDs, positional relationship between the PSD 72 and the slot 11d, and so on, even in a cross-slotted state, the interception can result (the case where the interception width D is generated). In the case, the interception width D becomes further larger than that expected in the case that is normally regarded as a state where the wafers W are multi-slotted. Accordingly, by setting the threshold value as a known plural wafers width and by comparing the known plural wafers width and the interception width D (S208), whether the wafers W are in a multi-slotted state or in a cross-slotted state can be identified. That is, when the interception width D is larger than the known plural wafers width, the cross-slotted state is identified (S211), and the slot 11d corresponding to the PSD output is identified that the wafer is improperly accommodated therein (S212). Furthermore, when the interception width D is not larger than the known plural wafers width, a multi-slotted state is identified (S213), and the slot 11d corresponding to the PSD output is judged that the wafers are improperly accommodated therein (S214).

When the above-mentioned processing is performed at the wafer detection module 76, the accommodation state of a wafer W in all of the slots 11d in the cassette 11 can be accurately detected, and even the improper wafer accommodation state such as a multi-slotted state or a cross-slotted state can be accurately identified.

The operations in the wafer mapping system 2 are similar to those in the case of the wafer mapping system 1 according to the first embodiment. First, a cassette 11 is placed on a susceptor 3 and the cassette 11 is moved up to a shutter 15a. Then, a lid 11b is held with the shutter 15a and removed as the shutter 15a retreats (FIG. 3). At this time, in FIG. 7A, an arm 53 is in a state before gyration and wobble and shown with a solid line. From this state, owing to a forward movement relative to an air cylinder 56 of a rod 57, the arm 53 wobbles through link members (55a, 55b) and a wobble shaft 54 up to a position of a double-dashed line, and an LD 71 attached to one end 53a of the arm 53 forwards into a cassette 11.

When the LD 71 proceeds into the cassette 11, from the LD 71 a beam of light is emitted to a receiver 72. By means of an elevation mechanism 15c of a shutter driver 15 the shutter 15a is lowered, at the same time the scanning is performed between the LD 71 and the PSD 72, and where a wafer W is present a signal passage is intercepted, and where there is no wafer W, the signal passage is not intercepted and a signal reaches the PSD 72 and is received there.

As the LD 71 descends, sequentially an output of each of the PSDs 72 corresponding to a position of the LD 71 in motion can be obtained. When as the shutter 15a descends the LD 71 is past a slot 11d in the lowermost tier of the cassette 11, outputs of all PSDs 72 can be obtained. In a wafer detection module 76, as mentioned above, an accommodation state of a wafer W in each of the slots 11d is detected, and thereby wafer accommodation information of the cassette 11 can be obtained. The wafer accommodation information is used in the processing at a process portion 19.

In the cassette 11, when the signal transmission for detecting the wafer W has come to completion, the arm 53, from a state projected into a passage 10a, retreats again to a state shown with a solid line in FIG. 7.

The above-mentioned is an explanation of the wafer mapping system 2 according to the second embodiment. According to the wafer mapping system 2, a high accuracy detector that, with a simple device configuration, can accurately detect an accommodation state of wafers in the FOUP can be obtained.

Furthermore, the second embodiment, without restricting to the above, can be modified and carried out, for instance, as follows.

(1) In the second embodiment, an example in which as a PSD output (receiver output) that is counted in correspondence to a position of an LD 71 (transmitter 71) in motion along a height direction of a cassette 11, only an intensity output I is used is explained. However, the counting may be performed of both the intensity output I and the position output Xm.

Figure 17A:
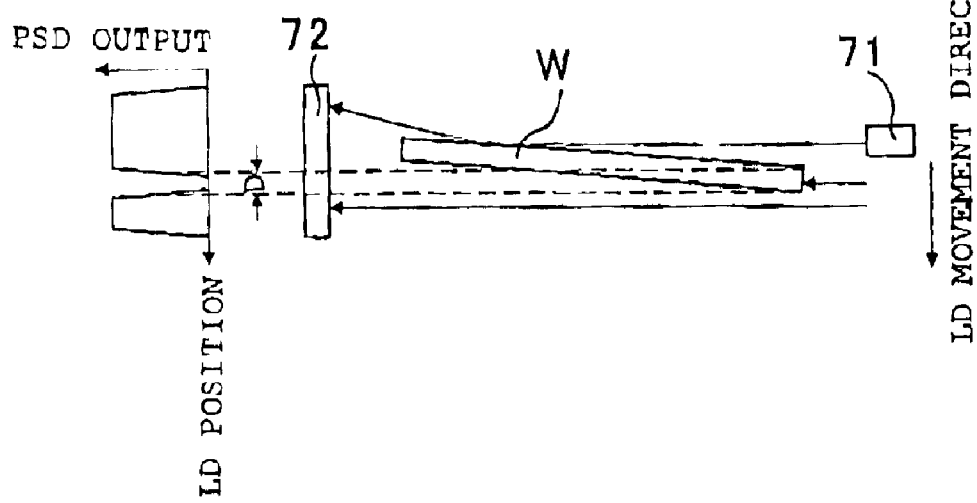
FIG. 17 is a diagram for explaining signal passages when a wafer is accommodated at a tilt.
Figure 17B:
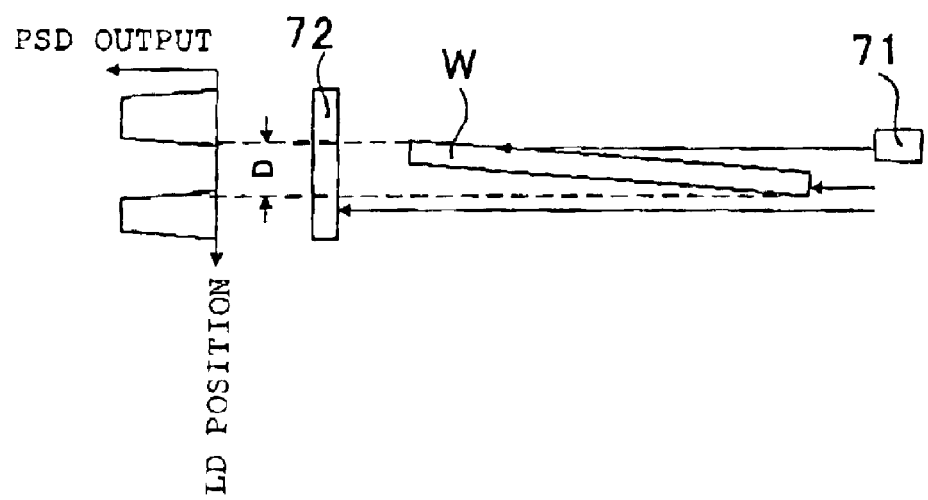

FIG. 17 is a diagram for explaining a signal passage when a wafer W is inclined. When the wafer W tilts a little with respect to an optical axis (irradiation direction of a beam of light) of the transmitter 71, a signal irradiated from the LD 71 is reflected and intercepted not only at a side surface of the wafer W but also at a surface of the wafer W. That is, when the signal is reflected at the surface of the wafer W, since the signal passage from the LD 71 to the PSD 72 is deflected, the signal enters obliquely into the PSD 72. At this time, when the reflectance of a surface of the wafer W is high, as shown in FIG. 17A, the signal, reflected at the surface of the wafer W and without being substantially attenuated, enters the PSD 72. On the other hand, when the reflectance of a surface of the wafer W is low, as shown in FIG. 17B, the signal, reflected at the surface of the wafer W and attenuated largely, enters the PSD 72. Thus, when the reflectance of the surface of the wafer W is different, even when an angle of inclination of the wafer W is the same as shown in FIGS. 17A and 17E, in some cases, a magnitude of the interception width D that is calculated as a length of a portion where the signal is not received may become largely different one. Accordingly, when, as the wafers W accommodated in the cassette 11, ones of high reflectance and ones of low reflectance are mingled, there may be cases where a preset threshold value (known wafer width Dv and so on) that is compared with the interception width D for identifying the accommodation state of the wafer W cannot be properly determined.

Consequently, the wafer detection module 76, based on an intensity output I and an positional output Xm (outputs I and Xm calculated at the receiver controller 73) due to the signal received at the PSD 72 (receiver 72), for each of the slots 11d of the cassette 11, a reception signal entire width C1 corresponding to a distribution length of the intensity output I counted in accordance with a position of the LD 71 (transmitter 71) in motion along a height direction of the cassette 11 is calculated. Then, similarly, for each of the slots 11d, a reception signal interception width D2 corresponding to a length of a portion where because of the interception due to the wafer W of the signal passage to the PSD 72, a signal that is received through only one straight passage from the LD 71 in the entire width C1 (a signal incident directly on the PSD 72 from the LD 71 without being reflected at a surface of the wafer W) is not received is calculated.

Figure 19:
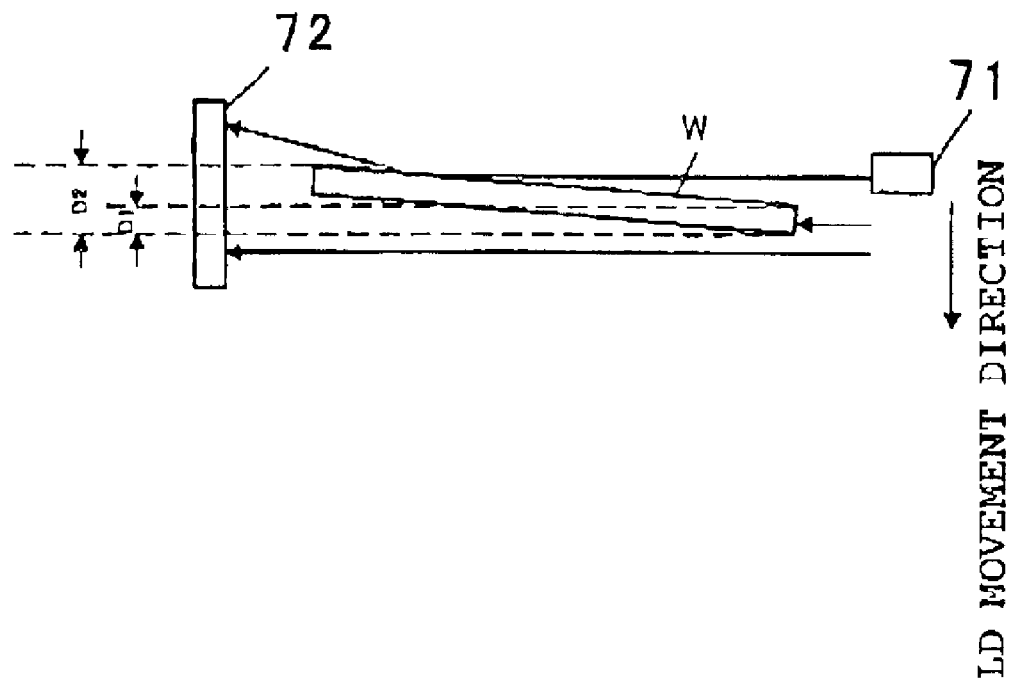
FIG. 19 is a diagram for explaining an accommodation state of the wafer corresponding to a detection example of FIG. 18.

FIG. 18 is a diagram for explaining a method of calculating the entire width C1 and the interception width D2, and shows distributions in which the intensity output I and the positional output Xm of the PSD 72 that are detected when the wafer W is accommodated at a tilt are counted in correspondence to a position of the LD 71. Furthermore, FIG. 19 is a diagram for explaining an accommodation state of the wafer W corresponding to a detection example of FIG. 18. In FIG. 19, a state where a PSD 72 side of the wafer W, as if lifted a little, is inclined is illustrated.

The positional output Xm of the PSD 72 versus the position of the LD 71, when the signal enters straight without being intercepted by the wafer W, varies linearly and becomes a distribution of a linear region shown in FIG. 18. On the other hand, when the signal is intercepted by the wafer W, the electrode signals I1, I2 are not properly obtained, and the positional output Xm cannot be calculated according to the equation (2). Accordingly, when the intensity output I is smaller than a preset threshold value Iv (intensity threshold value Iv) that is determined in advance, the wafer detection module 76 neglects the positional output Xm and processes as no data.

Furthermore, when the signal is reflected at the surface of the wafer W and thereby intercepted, since the signal passage is deflected at the surface of the wafer W, in the example of FIG. 19, a position of a signal incident on the PSD 72 moves in a direction opposite to that of a movement of the LD 71. Accordingly, the distribution of the positional output Xm, as shown in FIG. 18, deviates from a distribution of a straight linear region and becomes a distribution of a curved reflection region.

Here, similarly to the second embodiment, when the wafer detection module 76 calculates a length of a portion whose intensity output I is the intensity threshold value Iv or less (corresponds to a length of a portion where the signal is not received), a length of the interception width is calculated as D1. However, in consideration of the presence of the reflection region, the water detection module 76 calculates a length D2 that is obtained by adding a portion whose intensity output I is the intensity threshold value Iv or less and a portion where although the intensity output I is the intensity threshold value Iv or more, the positional output Xm is outside of the linear region.

Whether the positional output Xm is outside of the linear region or not can be identified based on a determination method M1 according to the following equation (3) or a determination method M2 according to the following equation (4).

$$\Delta 1 = A1 \times LD \text{ position} + A2 - Xm \tag{3}$$

$$\Delta 2 = \text{reference value of the positional output } Xm - \text{positional output } Xm \tag{4}$$

In the determination method M1, when an absolute value of Δ1 calculated according to the equation (3) exceeds a preset threshold value determined in advance, the positional output Xm is identified to be outside of the linear region. The LD position in the equation (3) is a coordinate of the LD position shown in FIG. 18, and A1 and A2 are constants.

Furthermore, in the determination method M2, a difference Δ2 between a reference value of the positional output Xm measured in a state where there is no wafer W at the preliminary machine adjustment or the like and the positional output Xm is calculated based on the equation (4), and when the Δ2 exceeds a preset threshold value that is determined in advance, the positional output Xm is identified to be outside of the linear region.

As mentioned above, when the entire width C1 and the interception width D2 are calculated, subsequently, the wafer detection module 76, according to a procedure similar to that of the second embodiment, identifies an accommodation state of a wafer W. That is, the wafer detection module 76, first, compares a preset threshold value Cv that is determined in advance based on a dimension of a signal receivable width in each of the PSDs 72 (known PSD width Cv) and the entire width C1, and compares a preset threshold value Dv (known wafer width Dv) that is determined in advance based on the dimension of the water W and the interception width D2. Thereby, an accommodation state of the wafer W accommodated in each of the slots 11*d* can be identified.

According to a modification example explained in the above with reference to FIGS. 18 and 19, with the signal received reflected at the surface of the wafer W removed, the entire width C1 and the interception width D2 can be calculated. Thereby, even when the wafers W whose surfaces have largely different reflectance are mingled, without being influenced by the difference of the reflectance, an inclination state of the wafer W can be accurately evaluated. Accordingly, in addition to showing operational effects similar to the case of the second embodiment, even when the wafers W of different surface reflectance are mingled in the cassette 11, an accommodation state of the wafers W can be accurately detected.

(2) Furthermore, when the wafer detection module 76 counts both the intensity output I and the positional output Xm, a counting method different from that in the above modification example maybe selected. FIG. 20 is a diagram for explaining an example in which, in the case of the wafer W in the state shown in FIG. 19 being detected, the intensity output I and the positional output Xm are counted according to a method different from that of the above modification example, and the wafer accommodation state is identified.

Figure 20A:
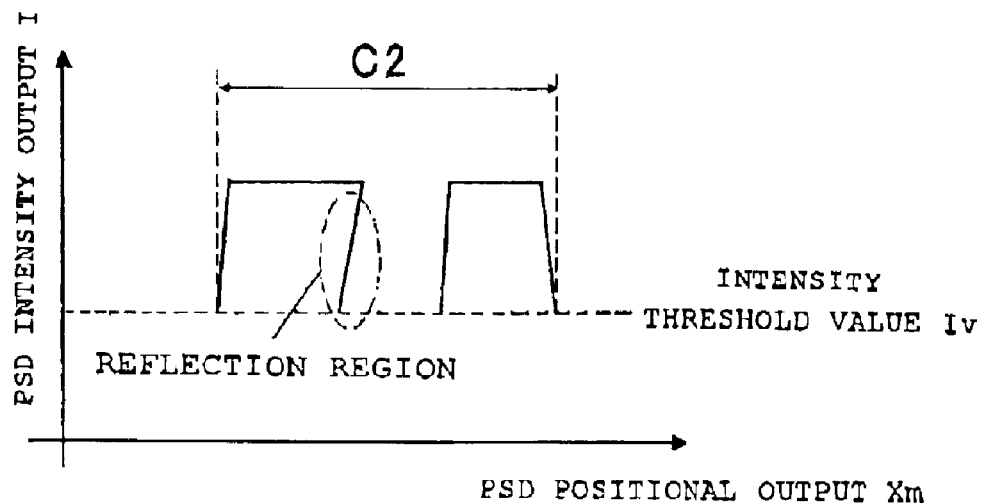
FIG. 20 is a diagram for explaining a modification embodiment of a wafer mapping system according to a second embodiment of the present invention, and show distributions of an intensity output to a position output of a receiver detected when a wafer is accommodated at a tilt.

First, on the basis of a signal received at the PSD 72 when the LD 71 travels along a height direction of the cassette 11, the receiver controller 73 calculates the intensity output I and the positional output Xm and transmits these to the wafer detection module 76. Then, as shown in FIG. 20A, the wafer detection module 76, based on the intensity output I and the positional output Xm according to the signals received at the PSD 72, for each of the slots 11*d* of the cassette 11, obtains a distribution of the intensity output I counted corresponding to the positional output Xm. In the signal received at the PSD 72 after reflected at the surface of the wafer W like an example of FIG. 19, a signal incidence position onto the PSD 72 moves in a direction opposite to a movement direction of the LD 71, and the intensity I diminishes. Accordingly, as shown in FIG. 20A, a distribution of the intensity output I counted in accordance with the positional output Xm becomes one having a multi-valued function-like reflection region. In FIG. 20A, a case where when the intensity output I is the intensity threshold value Iv or less, the processing is performed as no data available is shown.

Figure 20B:
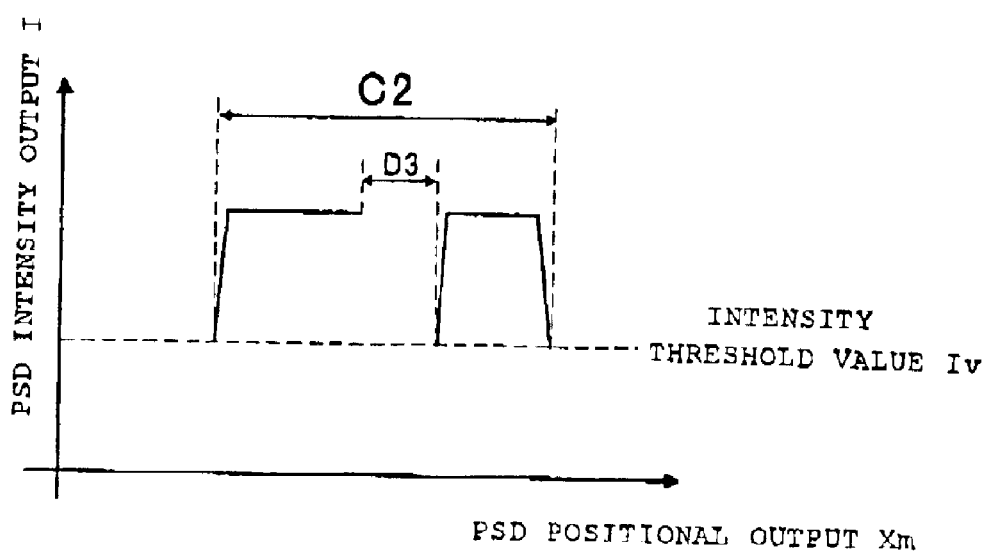

In the next place, the wafer detection module 76, when there are a plurality of intensity outputs I for the same positional output Xm (in the case of FIG. 20A), as shown in FIG. 20B, allows only the larger one in a value of the intensity output I to remain, and thereby corrects the distribution into a single-valued distribution.

Subsequently, the wafer detection module 76, from the distribution of FIG. 20A or FIG. 20B, calculates the reception signal entire width C2 that corresponds to a distribution length of the intensity output I. Furthermore, from the distribution of FIG. 20B, a length D3 of a portion where the distribution of the intensity output I is not present is calculated. By calculating the length D3, the reception signal interception width D3 corresponding to a length of a portion where the signal that is received through only one straight passage from the LD 71 in the entire width C2 is not received because the signal passage to the PSD 72 is intercepted by the wafer W is calculated.

As mentioned above, when the entire width C2 and the interception width D3 are calculated, in the next place, the wafer detection module 76, according to the procedure similar to that of the second embodiment, identifies an accommodation state of a wafer W. That is, the wafer detection module 76, first, compares a preset threshold value Cv (known PSD width Cv) that is determined in advance based on a dimension of the signal receivable width in each of the PSDs 72 and the entire width C2, and compares a preset threshold value Dv (known wafer width Dv) that is determined in advance based on a dimension of the wafer W and the interception width D3. Thereby, an accommodation state of a wafer W accommodated in each of the slots 11*d* can be identified.

According to the modification example above explained with reference to FIG. 20, with the signal received after reflected at a surface of the wafer W removed, the entire width C2 and the interception width D3 can be calculated. Thereby, even when there are wafers W that are different in reflectance of the wafer surface, without being influenced by the difference of the reflectance, an inclination state of the wafer W can be accurately evaluated. Accordingly, the operational effect similar to that of the second embodiment can be obtained, and even when the wafers W different in surface reflectance are mingled in the cassette 11, an accommodation state of the wafers W can be accurately detected.

Furthermore, even when there is no positional information when the LD 71 (transmitter 71) moves, the entire width C2 along a height direction of the cassette 11 and the interception width D3 can be calculated. That is, since there is no need of the positional information of the LD 71 when the entire width C2 and the interception width D3 are calculated, as the movement mechanism of the transmitter 71, there is no need of using one such as the stepping motor 60 that can precisely detect a position in motion. For instance, as the elevation mechanism 15*c* of the transmitter 71, a simple mechanism such as an air cylinder or the like can be used, and thereby a movement mechanism of the transmitter 71 can be simplified.

Figure 21:
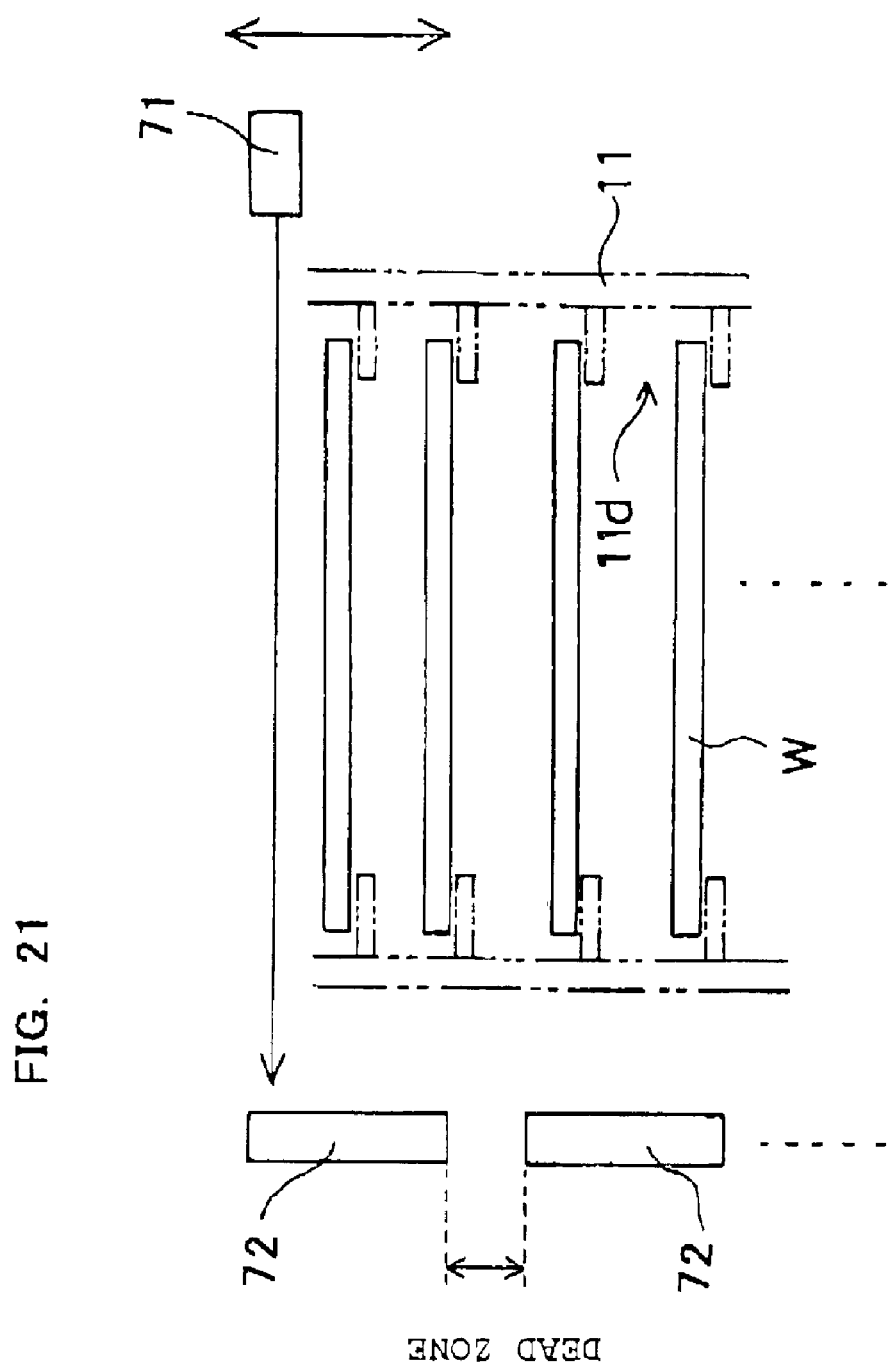
FIG. 21 is a diagram for explaining a modification embodiment of a wafer mapping system according to a second embodiment of the present invention.

(3) In the second embodiment, although each of the receivers 72 is disposed so as to correspond to each of the slots 11*d* of the cassette 11, it is not necessarily disposed like this. For instance, as shown in FIG. 21, even when each of the receivers 72 is disposed so as to correspond to a plurality of tiers (for two tiers each in FIG. 21) of the slots 11*d* of the cassette 11, an effect of the present invention can be attained. In this case, depending on the interception width D, a multi-slotted state and a cross-slotted state can be identified. In this case, in some cases, in the PSD distribution, a plurality of interception widths D may be present. At this time, the PSD entire width is calculated similarly to the second embodiment, and in addition a center position of the PSD entire width is calculated. By grasping a situation of a change of the PSD entire width and the center position, the cross-slotted state is identified and detected.

(4) As shown in a modification example of FIG. 21, between adjacent receivers 72 there is a zone where the receiver 72 is not disposed (dead zone) However, the receivers 72 may be moved so that a position of the dead zone may be shifted. That is, a plurality of receivers 72 serially arranged along a height direction of the cassette 11 may be disposed movable in a height direction of the cassette 11 at least by a distance corresponding to a length of the dead zone. For instance, the member 59 shown in FIG. 7 may be one that can be reciprocally moved up and down by a distance corresponding to a length of the dead zone. When configured like this, after the transmitter 71 is once moved up and down to detect an accommodation state of wafers W, the receivers 72 are moved up and down by a distance corresponding to a length of the dead zone, and the transmitter 71 is again moved up and down and thereby the accommodation state of the wafers W can be detected. When the receiver outputs due to the signals received two times at the receivers 72 are overlapped, a receiver output similar to one that can be obtained when a portion thereto the receiver 72 is not disposed is not present can be obtained. Accordingly, the accommodation state of a wafer W in each of the slots 11*d* can be accurately detected and a plurality of the receivers 72 can be laconically and effectively arranged.

Figure 22:
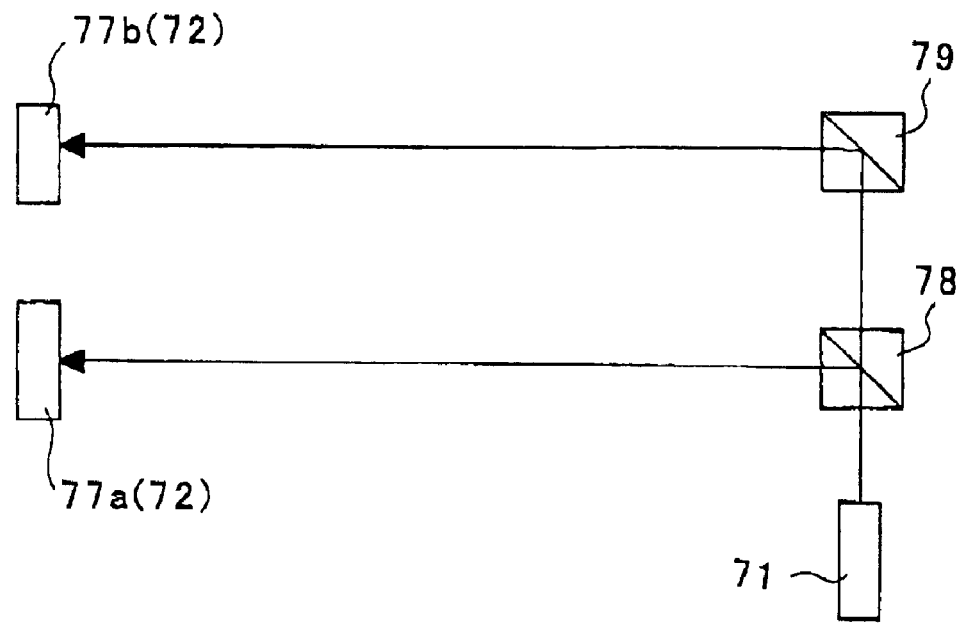
FIG. 22 is a diagram for explaining a modification embodiment of a wafer mapping system according to a second embodiment of the present invention.

(5) Furthermore, in the second embodiment, a plurality of receivers 72 serially arranged along a height direction of the cassette 11 is arranged in a single column. However, it is not necessarily arranged like this. That is, a plurality of receivers 72 may be arranged in a plurality of columns along a height direction of the cassette 11. FIG. 22 shows this modification embodiment and is a schematic diagram showing a situation in which a positional relationship of receiver columns arranged in two columns (receiver column 77*a* and receiver column 77*b*) and the transmitter 71 is seen from above. Part of a beam of light emitted from the transmitter 71 is separated through a half mirror 78 and is received with the receiver 72 arranged in the receiver column 77*a*. Furthermore, a remaining beam of light that has transmitted through the half mirror 78 is refracted with a prism 79 and received with the receiver 72 arranged in the receiver column 77*b*. In the plurality of receiver columns 77*a* and 77*b*, the receivers 72 each are arranged so that positions of the respective receivers 72 are displaced from those of other column in a height direction of the cassette 11. Accordingly, even when there is a zone (dead zone) where the receiver 72 is not disposed in one receiver column, a state where at the position corresponding to that portion the receiver 72 is disposed in the other receiver column can be obtained. Thereby, an effect similar to the case (the case of the above-mentioned modification embodiment) where after the accommodation state of the wafers W is once detected with the transmitter 71, a receiver column arranged in a single column is moved up and down by a distance corresponding to the dead zone, and the transmitter 71 is again moved up and down to detect the accommodation state of the wafer W can be obtained. That is, when the receiver outputs received at the respective receiver columns (77*a* and 77*b*) are added, an effect that the receiver output similar to the case where there is no dead zone can be obtained. Accordingly, the accommodation state of a wafer W in each of the slots 11*d* of the cassette 11 can be accurately detected, and a plurality of receivers 72 can be laconically and effectively arranged.

Furthermore, in a modification embodiment shown in FIG. 22, a passage to the receiver 72 of a beam of light emitted as a signal from the transmitter 71 is divided by use of a half mirror 79, and thereby each of beams of light can be emitted toward each of the receivers 72 arranged in a plurality of receiver columns (77*a* and 77*b*). Thereby, even when a plurality of receivers 72 that is serially arranged is arranged in a plurality of columns, with one transmitter 71, beams of light each can be simultaneously emitted toward the corresponding receiver columns (77*a*, 77*b*) arranged in a plurality of columns. Accordingly, a system configuration of the wafer mapping system can be simplified. The plurality of receiver columns may be disposed in three or more columns. In this case, when a beam of light is divided two or more times with half mirrors, beams of light can be emitted toward the receivers of the respective receiver columns.

(6) In the second embodiment, an example in which a beam of light emitted from the transmitter 71 is received as it is at the receiver 72 is explained. However, it is not necessarily carried out like this. For instance, an irradiation diameter of a beam of light emitted as a signal from the transmitter 71 may be reduced in its diameter by use of focusing means, and thereby a beam reduced in its diameter may be emitted to the receiver 72. That is, when a lens or the like is disposed as the focusing means between the transmitter 71 and the receiver 72, and thereby an irradiation diameter of a beam emitted from the transmitter 71 can be reduced. According to the configuration, the irradiated beam can be prohibited from diverging, and a stable beam passage from the transmitter 71 to the receiver 72 can be easily formed. Accordingly, a reception accuracy of the beam emitted from the transmitter 71 in the receiver 72 can be improved, and the accommodation state of the wafer W in the FOUP can be accurately detected.

(7) Furthermore, one in which a passage to the receiver 72 of a beam of light emitted as a signal from the transmitter 71 is changed by use of means for reflecting or refracting a beam of light, or for guiding a beam of light, and thereby an irradiation angle of the beam of light to the receiver 72 is adjusted can be used. As the means for reflecting a beam of light, as shown in FIG. 22, a mirror or the like can be used. Furthermore, as the means for refracting a beam of light, as shown in FIG. 22, a prism or the like can be used. As the means for guiding a beam of light, a light pipe such as optical fibers can be used. In this case, a tip end of the optical fibers is extended up to an attachment position of the transmitter 71 in FIG. 7 to attach, and a beam of light may be emitted from the tip end thereof. Thus, by use of the means for reflecting or refracting a beam of light, or the means for guiding a beam of light, an irradiation angle of a beam of light to the receiver 72 can be easily adjusted, and thereby a reception accuracy of a beam of light can be improved.

Figure 23A:
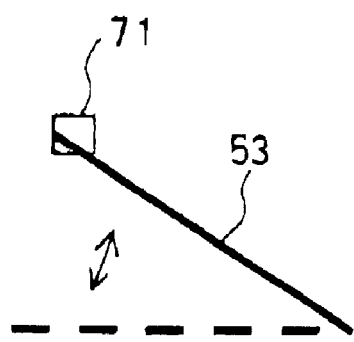
FIG. 23 is a diagram for explaining a modification embodiment of a wafer mapping system according to a second embodiment of the present invention.
Figure 23B:
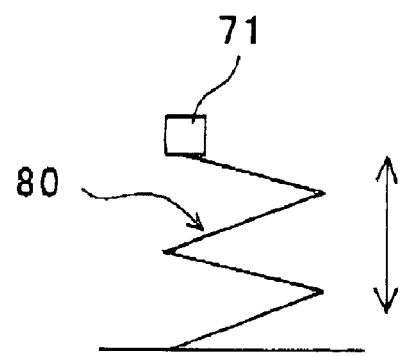

(8) As shown in a schematic view of FIG. 23A, in the second embodiment, the transmitter 71 is attached to an arm 53 that can be wobbled, and owing to the configuration the transmitter 71 is allowed proceeding into the cassette 11. It is not necessarily arranged like this. For instance, as shown in FIG. 23B, a plurality of link members may be combined in a cornice, and a transmitter 71 may be attached to a tip end of a cornice arm 80 capable of moving vertically to the cassette 11 (capable of moving reciprocally in a direction of arrow marks at both ends in the drawing). According to the configuration too, an effect similar to the present invention can be attained.

(9) In the second embodiment, only the transmitter 71 is attached movably toward the inside of the cassette 11. However, a plurality of receivers 72 also may be configured movable toward the inside of the cassette 11. For instance, to the member 59 shown in FIG. 7, an arm that integrally supports a plurality of receivers 72 is attached, and the arm may be supported movable toward the inside of the cassette 11.

(10) In the second embodiment, the transmitter 71 is attached to the shutter 15*a*. However, even when the transmitter 71 is attached to an elevator disposed separately from the shutter driver 15, an effect similar to the present invention can be attained.

(11) In the second embodiment, a plurality of receivers 72 is attached to the member 59 extended in parallel with the separation wall 10. However, even when a plurality of receivers 72 is integrally attached to the separation wall 10, an effect similar to the present invention can be attained.

(12) In the second embodiment, a signal passage formed between the transmitter 71 and the receiver 72 is intercepted by the presence of a wafer W, and thereby an accommodation state of the wafer W is detected. However, it is not necessarily performed like this. For instance, a signal reflected at a peripheral side surface of the wafer W may be received with the receiver 72, and thereby the presence of the wafer W may be detected.

The present invention is explained of preferred embodiments (the first and second embodiments). However, it is of course that all of modifications and applications, and equivalents that are thought of by reading and understanding the specification, and contained in the scope of claims are contained in the present invention.

What is claimed is:

1. A wafer mapping system that is provided with an access port for transferring in and out a wafer, and performs a detection operation of an accommodated wafer to a cassette in which slots for accommodating and holding substantially level a plurality of inserted wafers are disposed in a plurality of tiers, comprising:

a receiver that is fixed to a member facing to the access port and formed of receiving elements arranged serially along a height direction of the cassette; and a transmitter that is disposed movably in a up and down direction of the cassette and transmits a signal toward a wafer accommodated in each of the slots of the cassette;

wherein the receiver receives a signal transmitted from the transmitter, and thereby presence or absence and a state of a wafer accommodated in each of the slots of the cassette are detected.

2. A wafer mapping system according to claim 1:

wherein the transmitter is attached movably toward inside of the cassette to a shutter driver that moves forward and backward and elevates a shutter that opens and closes the access port, and when the wafer intercepts a signal passage from the transmitter to the receiver, presence or absence of the wafer and a state thereof are detected.

3. A wafer mapping system according to claim 1:
wherein the receiver is a CCD element.

4. A wafer mapping system according to claim 1:
wherein the receiver, in concerting with an up and down movement of the transmitter, sequentially selects the receiving element and thereby makes the signal receivable.

5. A wafer mapping system according to claim 4:
wherein the receiving elements are plurally selected, and reception results in a serial direction in the plurality of receiving elements are statistically processed to identify presence or absence of the wafer and a state thereof.

6. A wafer mapping system that is provided with an access port or transferring in and out a wafer, and performs a detection operation of an accommodated wafer to a wafer accommodation container in which slots for accommodating and holding substantially level a plurality of inserted wafers are disposed in a plurality of tiers, comprising:

a plurality of receivers that is fixed to a member facing the access port and arranged serially along a height direction of the wafer accommodation container; and a transmitter that is disposed movable in a up and down direction of the wafer accommodation container and transmits a signal toward a wafer accommodated in each of the slots of the wafer accommodation container;

wherein by receiving a signal transmitted from the transmitter with the receiver, presence or absence and a state of a wafer accommodated in each of the slots of the wafer accommodation container is detected.

7. A wafer mapping system according to claim 6:
wherein the transmitter is attached movably toward inside of the wafer accommodation container to a shield plate driver that moves forward and backward and elevates a shield plate that opens and closes the access port, and when the wafer intercepts a signal passage from the transmitter to the receiver, presence or absence of the wafer and a state thereof are detected.

8. A wafer mapping system according to claim 6:
wherein the plurality of receivers is disposed so that each of the receivers corresponds to each of the slots of the wafer accommodation container, or so that each of the receivers corresponds to a plurality of tiers of the slots in the wafer accommodation container.

9. A wafer mapping system according to claim 6:
wherein an irradiation diameter of a beam of light emitted as a signal from the transmitter is reduced in its diameter by use of focusing means, and thereby a beam of light reduced in its diameter is emitted to the receiver.

10. A wafer mapping system according to claim 6:
wherein a passage to the receiver of a beam of light emitted as a signal from the transmitter is changed by use of light beam reflection means or light beam refraction means or light beam guiding means, and thereby an angle of light beam irradiation to the receiver is adjusted.

11. A wafer mapping system according to claim 6:
wherein based on a receiver output due to a signal received at the receiver, for each of the slots of the wafer accommodation container, a reception signal entire width corresponding to a distribution length of the receiver output counted in response to a position of the transmitter in motion along a height direction of the wafer accommodation container, and a reception signal interception width corresponding to a length of a portion where the signal is not received in the reception signal entire width because a signal passage to the receiver is intercepted by the wafer are calculated; and a preset threshold value determined based on a dimension of a signal receivable width in each of the receivers and the reception signal entire width are compared, a preset threshold value determined based on a dimension of the wafer and the reception signal interception width are compared, and thereby an accommodation state of the wafer accommodated in each of the slots is identified.

12. A wafer mapping system according to claim 6:
wherein the receiver is capable of detecting an intensity of a received signal and a reception position in the receiver of the received signal; and
the receiver outputs an intensity output corresponding to the intensity of the signal received at the receiver and a positional output corresponding to the reception position, or outputs information in a state capable of calculating the intensity output and the positional output;
wherein based on the intensity output and the positional output due to a signal received at the receiver, for each of the slots of the wafer accommodation container; a reception signal entire width corresponding to a distribution length of the intensity output counted in response to a position of the transmitter in motion along a height direction of the wafer accommodation container, and a reception signal interception width corresponding to a length of a portion where the signal that is received through only one straight passage from the transmitter is not received in the reception signal entire width because a signal passage to the receiver is intercepted by the wafer are calculated; and
a preset threshold value determined based on a dimension of a signal receivable width in each of the receivers and the reception signal entire width are compared, and a preset threshold value determined based on a dimension of the wafer and the reception signal interception width are compared, and thereby an accommodation state of the wafer accommodated in each of the slots is identified.

13. A wafer mapping system according to claim 6:
wherein the receiver is capable of detecting an intensity of a received signal and a reception position in the receiver of the received signal; and
the receiver outputs an intensity output corresponding to the intensity of the signal received at the receiver and a positional output corresponding to the reception position, or outputs information in a state capable of calculating the intensity output and the positional output;
wherein based on the intensity output and the positional output due to a signal received at the receiver when the receiver moves along a height direction of the wafer accommodation container, for each of the slots of the wafer accommodation container, a reception signal entire width corresponding to a distribution length of the intensity output counted in response to the positional output, and a reception signal interception width corresponding to a length of a portion where the signal that is received through only one straight passage from the transmitter is not received in the reception signal entire width because a signal passage to the receiver is intercepted by the wafer are calculated; and
a preset threshold value determined based on a dimension of a signal receivable width in each of the receivers and the reception signal entire width are compared, and a preset threshold value determined based on a dimension of the wafer and the reception signal interception width are compared, and thereby an accommodation state of the wafer accommodated in each of the slots is identified.

14. A wafer mapping system according to claim 6:
wherein based on a receiver output due to a signal received at the receiver, for each of the slots of the wafer accommodation container, a reception signal entire width corresponding to a distribution length of the receiver output counted in response to a position of the transmitter in motion along a height direction of the wafer accommodation container, a reception signal interception width corresponding to a length of a portion where the signal is not received in the reception signal entire width because a signal passage to the receiver is intercepted by the wafer, and a reception signal interception position corresponding to a position where a center of the receiver signal interception width is in the reception signal entire width are calculated; and
a preset threshold value determined based on the dimension of the wafer and the interception position and the reception signal interception width are compared, a preset threshold value determined based on a dimension of the signal receivable width in each of the receivers and the reception signal interception width are compared, and thereby an accommodation state of the wafer accommodated in each of the slots is identified.

15. A wafer mapping system according to claim 12:
wherein based on a receiver output due to a signal received at the receiver, for each of the slots of the wafer accommodation container, a reception signal entire width corresponding to a distribution length of the receiver output counted in response to a position of the transmitter in motion along a height direction of the wafer accommodation container, a reception signal interception width corresponding to a length of a portion where the signal is not received in the reception signal entire width because a signal passage to the receiver is intercepted by the wafer, and a reception signal interception position corresponding to a position where a center of the receiver signal interception width is in the reception signal entire width are calculated; and
a preset threshold value determined based on a dimension of the wafer and the interception position and the reception signal interception width are compared, a preset threshold value determined based on a dimension of a signal receivable width in each of the receivers and the reception signal interception width are compared, and thereby an accommodation state of the wafer accommodated in each of the slots is identified.

16. A wafer mapping system according to claim 13:
wherein based on a receiver output due to a signal received at the receiver, for each of the slots of the wafer accommodation container, a reception signal entire width corresponding to a distribution length of the receiver output counted in response to a position of the transmitter in motion along a height direction of the wafer accommodation container, a reception signal interception width corresponding to a length of a portion where the signal is not received in the reception signal entire width because a signal passage to the receiver is intercepted by the wafer, and a reception signal interception position corresponding to a position where a center of the receiver signal interception width is in the reception signal entire width are calculated; and
a preset threshold value determined based on the dimension of the wafer and the interception position and the reception signal interception width are compared, a preset threshold value determined based on a dimension of a signal receivable width in each of the receivers and the reception signal interception width are compared, and thereby an accommodation state of the wafer accommodated in each of the slots is identified.

17. A wafer mapping system according to claim 6:
wherein a plurality of receivers serially arranged along a height direction of the wafer accommodation container is capable of moving in a height direction of the wafer accommodation container at least by a distance corresponding to a length of a portion where a receiver is not disposed between adjacent receivers.

18. A wafer mapping system according to claim 6:
wherein a plurality of receivers serially arranged along a height direction of the wafer accommodation container is arranged in a plurality of columns along a height direction of the wafer accommodation container.

19. A wafer mapping system according to claim 18:
wherein a passage to the receiver of a beam of light emitted as a signal from the transmitter is divided by use of a half mirror, and thereby each of divided beams of light is emitted toward each of the receivers arranged in the plurality of columns.

* * * * *